(12) United States Patent
Kimura et al.

(10) Patent No.: US 8,608,864 B2
(45) Date of Patent: Dec. 17, 2013

(54) SUBSTRATE TREATING METHOD

(75) Inventors: Masahiro Kimura, Kyoto (JP); Hiroaki Takahashi, Kyoto (JP); Tadashi Maegawa, Kyoto (JP); Toyohide Hayashi, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 108 days.

(21) Appl. No.: 13/178,059

(22) Filed: Jul. 7, 2011

(65) Prior Publication Data
US 2011/0303242 A1 Dec. 15, 2011

Related U.S. Application Data

(62) Division of application No. 12/053,922, filed on Mar. 24, 2008, now abandoned.

(30) Foreign Application Priority Data

| Mar. 27, 2007 | (JP) | 2007-081593 |
| Mar. 27, 2007 | (JP) | 2007-081594 |
| Aug. 24, 2007 | (JP) | 2007-236766 |

(51) Int. Cl.
*B08B 3/00* (2006.01)
*B08B 7/04* (2006.01)
*B08B 6/00* (2006.01)

(52) U.S. Cl.
USPC .................. 134/26; 134/10; 134/1.3

(58) Field of Classification Search
USPC .......................... 134/26, 1.3, 184, 108, 42, 18
See application file for complete search history.

(56) References Cited

U.S. PATENT DOCUMENTS

| 5,149,379 A | 9/1992 | Gotoh | |
| 6,117,311 A * | 9/2000 | Stockhowe et al. | 210/109 |
| 6,216,364 B1 | 4/2001 | Tanaka et al. | |
| 6,354,311 B1 | 3/2002 | Kimura et al. | |
| 6,375,758 B1 | 4/2002 | Nakashima et al. | |
| 6,620,260 B2 | 9/2003 | Kumagai et al. | |
| 6,637,445 B2 | 10/2003 | Ogasawara et al. | |
| 6,790,291 B2 | 9/2004 | Kimura | |

(Continued)

FOREIGN PATENT DOCUMENTS

| JP | 3-146188 | 6/1991 |
| JP | 5-206096 | 8/1993 |

(Continued)

OTHER PUBLICATIONS

JP 2001267282 English Translation.*

(Continued)

*Primary Examiner* — Eric Golightly
*Assistant Examiner* — Arlyn I Rivera-Cordero
(74) *Attorney, Agent, or Firm* — Ostrolenk Faber LLP

(57) ABSTRACT

A substrate treating method for treating substrates with a treating liquid includes a deionized water cleaning step for supplying deionized water from an injection pipe and cleaning the substrates inside a cleaning tank with deionized water, then a replacing step for injecting a solvent from a solvent injector and replacing the deionized water with the solvent, a separating and removing step for switching a channel to a branch pipe and causing a separator to remove the deionized water from the treating liquid, and an adsorbing and removing step for switching the channel to another branch pipe and causing a deionized water remover to adsorb and remove the deionized water from the treating liquid.

10 Claims, 12 Drawing Sheets

(56) References Cited

U.S. PATENT DOCUMENTS

| | | | |
|---|---|---|---|
| 6,893,556 B2* | 5/2005 | Yaegashi et al. | 210/167.29 |
| 2003/0116174 A1* | 6/2003 | Park et al. | 134/1.3 |
| 2005/0230045 A1* | 10/2005 | Okuchi et al. | 156/345.18 |
| 2008/0072931 A1* | 3/2008 | Kimura | 134/26 |

FOREIGN PATENT DOCUMENTS

| | | | | |
|---|---|---|---|---|
| JP | 8-152268 | | 6/1996 | |
| JP | 10-22257 | | 1/1998 | |
| JP | 11-186209 | | 7/1999 | |
| JP | 2001-267282 | | 9/2001 | |
| JP | 2001267282 | * | 9/2001 | H01L 21/304 |
| JP | 2001-308058 | | 11/2001 | |
| JP | 2002-110621 | | 4/2002 | |
| JP | 2002-134458 | | 5/2002 | |
| JP | 2003-273061 | | 9/2003 | |
| JP | 2006-332215 | | 12/2006 | |

OTHER PUBLICATIONS

Japanese Office Action issued Jun. 14, 2011 in connection with corresponding Japanese Patent Application No. JP2007-081593.
Notice of Allowance issued Jun. 14, 2011 in connection with corresponding Japanese Patent Application No. JP2007-081594.
Notice of Allowance issued Nov. 30, 2009 in corresponding Korean Patent Application No. 10-2008-0026773.
Office Action dated Jul. 31, 2012 in copending U.S. Appl. No. 12/209,598 containing an obviousness double-patenting rejection over claim 1 in the present application.

* cited by examiner

SUBSTRATE TREATING METHOD

CROSS REFERENCE TO RELATED APPLICATIONS

The present application is a divisional application of U.S. Ser. No. 12/053,922 filed Mar. 24, 2008, which application claims benefit and priority of Japanese Application Nos. 2007-081593 filed Mar. 27, 2007, 2007-081594 filed Mar. 27, 2007 and 2007-236766 filed Aug. 24, 2007 which are all incorporated herein in their entirety.

BACKGROUND OF THE INVENTION (1) Field of the Invention

This invention relates to substrate treating apparatus for treating, e.g. cleaning, substrates such as semiconductor wafers or glass substrates for liquid crystal displays (hereinafter called simply substrates) with a treating liquid.

(2) Description of the Related Art

Conventionally, this type of apparatus includes, for example, a treating tank for storing a treating liquid and receiving substrates, and a nozzle for supplying isopropyl alcohol (IPA) gas to a space above the treating tank (see Japanese Unexamined Patent Publication H10-22257, for example). With this apparatus, after supplying deionized water to the treating tank and cleaning substrates, IPA gas is supplied to the space above the treating tank to form an IPA atmosphere therein. By pulling up and moving the substrates in the IPA atmosphere, the deionized water adhering to the substrates is replaced with IPA to promote drying of the substrates.

The conventional apparatus with such construction has the following drawback.

The conventional apparatus can promote drying of the substrates to some degree by pulling up the substrates cleaned with deionized water out of the deionized water, and moving the substrates in the IPA atmosphere. However, deionized water adhering to fine patterns formed on the substrates cannot be dried sufficiently, and thus a possibility of unsatisfactory drying performance.

In the latest semiconductor devices in the field of memory, capacitors constructed in a cylindrical shape have begun to be employed as a technique for drastically increasing the degree of integration. Such a cylindrical structure has a very high aspect ratio, and it is particularly difficult to dry sufficiently deionized water having entered gaps of that structure. Thus, the above drawback is notable here. A similar problem can occur also with devices related to what is known as MEMS (Micro Electro Mechanical Systems).

It is conceivable to pull up substrates after replacing deionized water with a solvent before pulling up the substrates, instead of using deionized water as final treating liquid. In this case, however, although it is important to replace the deionized water with the solvent sufficiently, the concentration of deionized water in the solvent cannot be reduced below a certain level even if a large quantity of solvent is mixed into the deionized water. The solvent cannot replace the deionized water sufficiently. Thus, there still is a possibility of unsatisfactory drying performance due to the deionized water.

When pulling up the substrates after replacing the deionized water with the solvent as noted above, even if a large quantity of solvent is mixed into the deionized water, the deionized water having entered fine structures of the substrates gradually mixes into the treating liquid, resulting in a phenomenon of the deionized water concentration gradually increasing in the treating liquid. Thus, there still is a possibility of unsatisfactory drying performance due to the deionized water. In addition, when the substrates are pulled up, the fine structures could collapse due to the surface tension of the deionized water.

A conventional apparatus of this type may include a plurality of treating tanks, and a transport mechanism for transporting substrates from one treating tank to another. The apparatus successively treats the substrates in different treating tanks with different treating liquids or solutions (see Japanese Unexamined Patent Publication H10-22257, for example). Such apparatus performs a series of treatments while moving the substrates successively such that, for example, the substrates have surfaces lightly etched with BHF (buffered hydrofluoric acid) in the first treating tank, and cleaned with deionized water in the second treating tank. The deionized water is replaced with IPA (isopropyl alcohol) in the third treating tank, and the substrates are dried in a solvent vapor atmosphere in the fourth treating tank.

The conventional apparatus with such construction has the following drawback.

With the substrates having fine patterns formed thereon, the fine patterns could collapse when the substrates are moved from one treating tank to another, due to the surface tension of deionized water remaining in the patterns.

SUMMARY OF THE INVENTION

This invention has been made having regard to the state of the art noted above, and its object is to provide a substrate treating apparatus free from unsatisfactory drying of substrates due to deionized water, which is achieved by minimizing deionized water concentration in a solvent.

Another object of the invention is to provide a substrate treating apparatus free from unsatisfactory drying of substrates and collapse of fine structures, which is achieved by minimizing deionized water in a treating liquid replaced with a solvent.

It is a further object of the invention to provide a substrate treating apparatus free from collapse of fine patterns formed on substrates, which is achieved by increasing a rate of removing deionized water.

The above object is fulfilled, according to this invention, by a substrate treating apparatus for treating substrates with a treating liquid, comprising a treating tank having an inner tank for storing the treating liquid, and an outer tank for collecting the treating liquid overflowing the inner tank; a supply pipe interconnecting the inner tank and the outer tank for circulating the treating liquid; a first branch pipe shunted from the supply pipe; a separating device mounted on the first branch pipe for separating deionized water and a solvent in the treating liquid, and discharging the deionized water; a second branch pipe interconnecting positions upstream and downstream of the separating device; a deionized water removing device mounted on the second branch pipe for adsorbing and removing deionized water from the treating liquid; an injection pipe connected to the supply pipe for injecting deionized water in a position downstream of the separating device; a solvent injecting device for injecting the solvent into the injection pipe; and a control device for carrying out a deionized water cleaning process for supplying deionized water from the injection pipe and cleaning the substrates inside the cleaning tank with the deionized water, then a replacing process for injecting the solvent from the solvent injecting device and replacing the deionized water with the solvent, a separating and removing process for switching to the first branch pipe and causing the separating device to remove the deionized water from the treating liquid, and an adsorbing and removing process for switching to the second branch pipe and causing the deionized water removing device to adsorb and remove the deionized water from the treating liquid.

According to this invention, the control device first carries out a deionized water cleaning process for supplying deionized water from the injection pipe and cleaning the substrates inside the cleaning tank with the deionized water, and then a replacing process for injecting the solvent from the solvent injecting device and replacing the deionized water with the solvent. Although the replacing process can replace a large part of deionized water with the solvent, the concentration of deionized water in the treating liquid cannot be reduced below a certain level. Then, the control device switches the flow of the treating liquid to the first branch pipe for the separating and removing process to remove the deionized water from the treating liquid with the separating device, and then switches the flow of the treating liquid to the second branch pipe for the adsorbing and removing process by the deionized water removing device. Consequently, the deionized water removing device can adsorb and remove only the deionized water mixed in the solvent. In this way, the deionized water concentration in the solvent is reduced to a minimal level. This prevents an unsatisfactory drying of the substrates due to the deionized water in the solvent.

The above adsorbing and removing device may be a molecular sieve, activated carbon or alumina, for example.

The apparatus according to this invention may further comprise a mixer mounted on the first branch pipe for mixing deionized water and solvent; and a third branch pipe interconnecting a position upstream of the mixer, and a position downstream of the mixer and upstream of the separating device; wherein the control device is arranged, when the solvent is water-soluble, to switch a flow of the treating liquid to the third branch pipe to carry out the separating and removing process, and when the solvent is water-insoluble, to allow the treating liquid to flow through the mixer to carry out the separating and removing process.

The separating device has a characteristic of tending to separate deionized water and solvent in a well mixed state better than when the deionized water and solvent are completely separated. Then, when the solvent is water-insoluble, the control device switches the flow of the treating liquid from the third branch pipe to the second branch pipe to carry out the mixing process for causing the mixer to mix the solvent and deionized water before the separating and removing process. Thus, the deionized water in the solvent is efficiently separated. Particularly where the solvent is water-insoluble such as a fluoric solvent, the deionized water and solvent do not mix easily. The mixing step by the mixer can improve the separating efficiency of the separating device.

In this invention, the separating device may have a filter for separating oil and water, a housing enclosing the filter, an inflow portion formed in the housing for introducing the treating liquid, an outflow portion formed in the housing for letting out the treating liquid having passed through the filter, a discharge portion formed in the housing for discharging deionized water separated by the filter, and a cooling device for cooling the filter.

Since solubility of deionized water in the solvent can be made the lower at the lower temperature, the separating efficiency of the deionized water and solvent is improved by cooling action of the cooling device.

In another aspect of the invention, a substrate treating apparatus for treating substrates with a treating liquid, comprises a treating tank having an inner tank for storing the treating liquid, and an outer tank for collecting the treating liquid overflowing the inner tank; a supply pipe interconnecting the inner tank and the outer tank for circulating the treating liquid; a deionized water supply device for supplying deionized water as treating liquid; a solvent supply device for supplying a solvent as treating liquid; a branch pipe shunted from the supply pipe; a deionized water removing device mounted on the branch pipe for removing deionized water from the treating liquid; a solvent injecting device for injecting the solvent into the supply pipe downstream of the deionized water removing device; and a control device for carrying out a deionized water cleaning process for supplying deionized water from the deionized water supply device and cleaning the substrates inside the cleaning tank with the deionized water, then a replacing process for injecting the solvent from the solvent supply device and replacing the deionized water with the solvent, a deionized water removing process for switching to the branch pipe and causing the deionized water removing device to remove the deionized water from the treating liquid, and causing the solvent injecting device to replenish the solvent.

According to this invention, the control device first carries out a deionized water cleaning process for supplying deionized water from the deionized water supply device and cleaning the substrates inside the cleaning tank with the deionized water, and then a replacing process for supplying the solvent from the solvent supply device and replacing the deionized water with the solvent. Thereafter, the control device carries out the deionized water removing process by switching to the branch pipe, and causing the deionized water removing device to remove deionized water from the treating liquid. Thus, insufficient drying and collapse of the fine structures can be prevented by removing the deionized water in the treating liquid replaced with the solvent as much as possible. Not only the deionized water in the treating liquid but a certain amount of solvent also is removed through the deionized water removing process, thereby decreasing the solvent. However, the solvent injecting device replenishes the solvent to compensate for the loss in quantity of the solvent accompanying the deionized water removal.

The apparatus according to the invention may further comprise a first mixer mounted on the branch pipe upstream of the deionized water removing device for mixing fluids; a deionized water injecting device for injecting deionized water into the branch pipe upstream of the first mixer; and a second mixer mounted on the supply pipe downstream of the solvent injecting device for mixing fluids; wherein the control device is arranged, when deionized water concentration in the treating liquid falls below a predetermined value, to inject deionized water from the deionized water injecting device, and control the deionized water injecting device and the solvent injecting device such that a sum of an injection rate of the solvent from the solvent injecting device and a difference between an injection rate of deionized water and a quantity of the treating liquid removed by the deionized water removing device becomes substantially zero.

When the deionized water concentration in the treating liquid falls below a predetermined value, the deionized water removing efficiency of the deionized water removing device will lower. Thus, the control device injects deionized water from the deionized water injecting device to maintain the deionized water removal efficiency as if with a nose medicine. At this time, the solvent concentration in the treating liquid may be kept constant by making substantially zero the sum of the injection rate of the solvent from the solvent injecting device, and the difference between the injection rate of deionized water and the quantity of the treating liquid (solvent and deionized water) removed by the deionized water removing device.

In a further aspect of the invention, a substrate treating apparatus for treating substrates with a treating liquid, comprises a treating tank for storing the treating liquid; a supply pipe for circulating the treating liquid to supply the treating liquid discharged from the treating tank back to the treating tank; a first branch pipe shunted from the supply pipe; a cooling device mounted on the first branch pipe for cooling the treating liquid flowing therethrough; a second branch pipe interconnecting positions of the supply pipe upstream and downstream of the cooling device; a separating device mounted on the second branch pipe for separating deionized water and a solvent in the treating liquid, and discharging the deionized water from the treating liquid; an injection pipe connected to the supply pipe for injecting deionized water in a position downstream of the separating device; a water-soluble solvent injecting device for injecting a water-soluble solvent into the injection pipe; a water-insoluble solvent injecting device for injecting a water-insoluble solvent into the injection pipe; and a control device for carrying out a deionized water cleaning process for cleaning the substrates inside the cleaning tank with deionized water, then a replacing process for injecting the water-soluble solvent from the water-soluble solvent injecting device into the supply pipe and replacing the deionized water with the water-soluble solvent, a cooling process by switching a channel to the first branch pipe for the cooling device to cool the treating liquid, a separating and removing process by switching a channel to the second branch pipe for the separating device to remove the deionized water from the treating liquid, and a replacement promoting process for injecting the water-insoluble solvent from the water-insoluble solvent injecting device into the supply pipe.

According to this invention, the control device carries out the deionized water cleaning process for cleaning the substrates in the treating tank with deionized water by supplying deionized water from the filling pipe to the supply pipe. This process removes chemicals, contaminants and the like from the substrates with deionized water. Next, the control device carries out the replacing process for injecting the water-soluble solvent from the water-soluble solvent injecting device into the supply pipe, and replacing the deionized water with the water-soluble solvent. After replacing the deionized water stored in the treating tank with the water-soluble solvent, the control device carries out the cooling process by switching the channel to the first branch pipe for the cooling device to cool the treating liquid. Subsequently, the control device carries out the separating and removing process by switching the channel to the second branch pipe for the separating device to remove deionized water from the treating liquid. Deionized water can be removed efficiently from the treating liquid since the treating liquid has been cooled in the cooling process to render the deionized water not readily dissolvable in the water-soluble solvent. Then, the replacement promoting process is performed by injecting the water-insoluble solvent from the water-insoluble solvent injecting device. The water-soluble solvent and deionized water are replaceable nearly completely with the water-insoluble solvent since the water-soluble solvent and deionized water are made not readily dissolvable in the water-insoluble solvent in the preceding cooling process. Thus, the deionized water in the treating tank can be removed efficiently to prevent the deionized water from remaining in the fine patterns formed on the substrates. As a result, this apparatus can prevent collapse of the fine patterns formed on the substrates.

The apparatus in this invention may further comprise a third branch pipe interconnecting positions upstream and downstream of the separating device; and a deionized water removing device mounted on the third branch pipe for adsorbing and removing the deionized water from the treating liquid; wherein the control device is arranged to switch the channel to the third branch pipe after the separating and removing process.

An increased removal rate is achieved by operating the deionized water removing device to adsorb and remove the deionized water remaining without being removed through the separating and removing process.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of this invention will be described in detail hereinafter with reference to the drawings.

Embodiment 1

Figure 1:
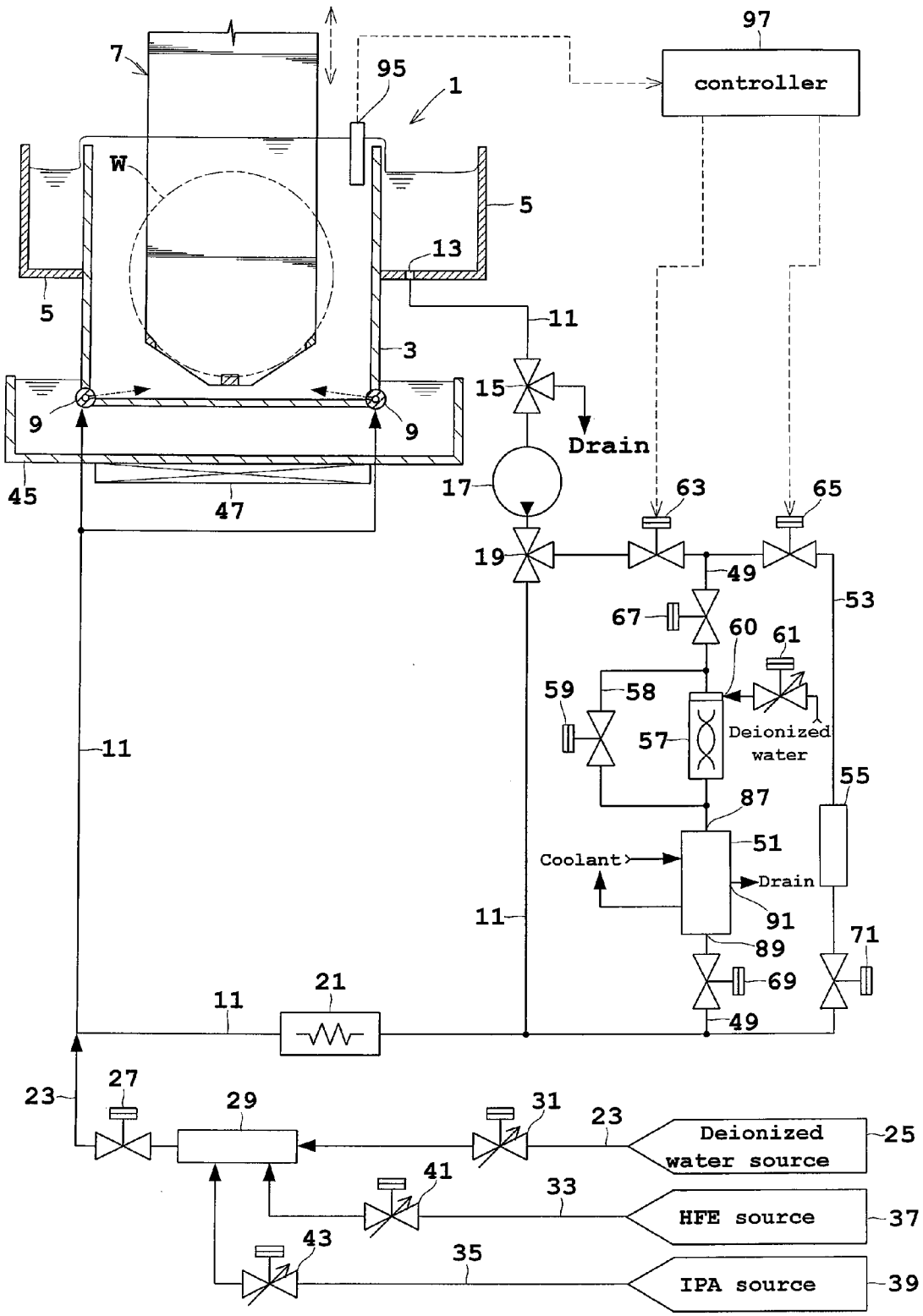
FIG. 1 is a block diagram showing an outline of a substrate treating apparatus in Embodiment 1.

FIG. 1 is a block diagram showing an outline of a substrate treating apparatus in Embodiment 1.

A treating tank 1 includes an inner tank 3 and an outer tank 5. The inner tank 3 stores a treating liquid or solution, and can receive wafers W held by a holding arm 7. The holding arm 7 includes support elements arranged on lower positions of an arm portion for contacting lower edges of the wafers W and supporting the wafers W in upstanding posture. The holding arm 7 is vertically movable between a treating position inside the inner tank 3 and a standby position above the inner tank 3. The inner tank 3 stores deionized water, solvents or a mixture thereof as a treating liquid or solution, and the treating liquid overflowing the inner tank 3 is collected in the outer tank 5 surrounding an upper portion of the inner tank 3. The inner tank 3 has two jet pipes 9 disposed at opposite sides in the bottom thereof for supplying the treating liquid into the inner tank 3.

The jet pipes 9 are connected to one end of a supply pipe 11 having the other end connected to a drain port 13 formed in the outer tank 5. The supply pipe 11 has a three-way valve 15, a pump 17, a three-way valve 19 and an in-line heater 21 arranged in order from upstream, i.e. adjacent the outer tank 5. The three-way valve 15 is switchable between circulation and drain of the treating liquid. The pump 17 circulates the treating liquid, and the three-way valve 19 is switchable between circulation of the treating liquid and removal of deionized water (to be described in detail hereinafter). The in-line heater 21 heats the treating liquid circulating through the supply pipe 11 to a predetermined temperature.

The supply pipe 11 has one end of an injection pipe 23 connected to a position thereof downstream of the in-line heater 21 and upstream of the jet pipes 9. The other end of the injection pipe 23 is connected to a deionized water source 25. The injection pipe 23 has a control valve 27, a mixing valve 29 and a flow control valve 31 arranged in order from downstream to upstream. The control valve 27 controls supply and cutoff of deionized water, solvents or a treating solution of solvents in deionized water. The mixing valve 29 has, connected thereto, one end of each of two chemical pipes 33 and 35, with the other ends thereof connected to an HFE source 37 and an IPA source 39, respectively. The two chemical pipes 33 and 35 have flow control valves 41 and 43 for adjusting flow rate, respectively. The mixing valve 29 has a function to mix one or both of HFE (hydrofluoroether), which is a water-insoluble fluoric solvent, and water-soluble IPA (isopropyl alcohol) into deionized water.

The mixing valve 29 corresponds to the solvent injecting device in this invention.

The inner tank 3 has a batting 45 disposed at the bottom thereof. The batting 45 has a vibrator 47 with an ultrasonic transducer attached to the bottom surface thereof. The batting 45 is filled with deionized water of a quantity that soaks a lower part of the inner tank 3. The vibrator 47 applies ultrasonic vibration to the treating liquid in the inner tank 3 through the deionized water of the batting 45.

The above vibrator 47 corresponds to the ultrasonic vibration applying device in this invention.

The supply pipe 11 has a first branch pipe 49 shunted therefrom. The first branch pipe 49 has an oil-water separation filter 51 for separating the deionized water and solvent in the treating liquid. The supply pipe 11 further includes a second branch pipe 53 extending parallel to the first branch pipe 49. The second branch pipe 53 communicates with the first branch pipe 49 in positions upstream and downstream of the oil-water separation filter 51. The second branch pipe 53 has an adsorption filter 55 for adsorbing and removing deionized water from the treating liquid.

The adsorption filter 55 is formed of a molecular sieve, activated carbon, alumina or the like, and has a function to adsorb and remove even a trace quantity of deionized water from the treating liquid.

The first branch pipe 49 noted above has a static mixer 57 disposed upstream of the oil-water separation filter 51. A third branch pipe 58 communicates with the first branch pipe 49 in positions upstream of this static mixer 57, and downstream of the static mixer 57 and upstream of the oil-water separation filter 51. The third branch pipe 58 includes a control valve 59 for controlling circulation therethrough. The static mixer 57 has an injection portion 60 disposed in an upstream position thereof for injecting deionized water into the treating liquid circulating through the first branch pipe 49, and a flow control valve 61 for controlling a flow rate of deionized water to the injection portion 60. As described in detail hereinafter, the static mixer 57 has no actuator, but agitates and mixes fluids by action of division, turning and reversal.

A control valve 63 is disposed between the three-way valve 19 and first branch pipe 49, and a control valve 65 is disposed between the control valve 63 and second branch pipe 53. The first branch pipe 49 has a control valve 67 disposed in the most upstream position thereof, and a control valve 69 in the most downstream position. The second branch pipe 53 has a control valve 71 disposed downstream of the adsorption filter 55.

The oil-water separation filter 51 corresponds to the separating device in this invention. The adsorption filter 55 corresponds to the deionized water removing device in this invention. The static mixer 57 corresponds to the mixer in this invention.

Figure 2:
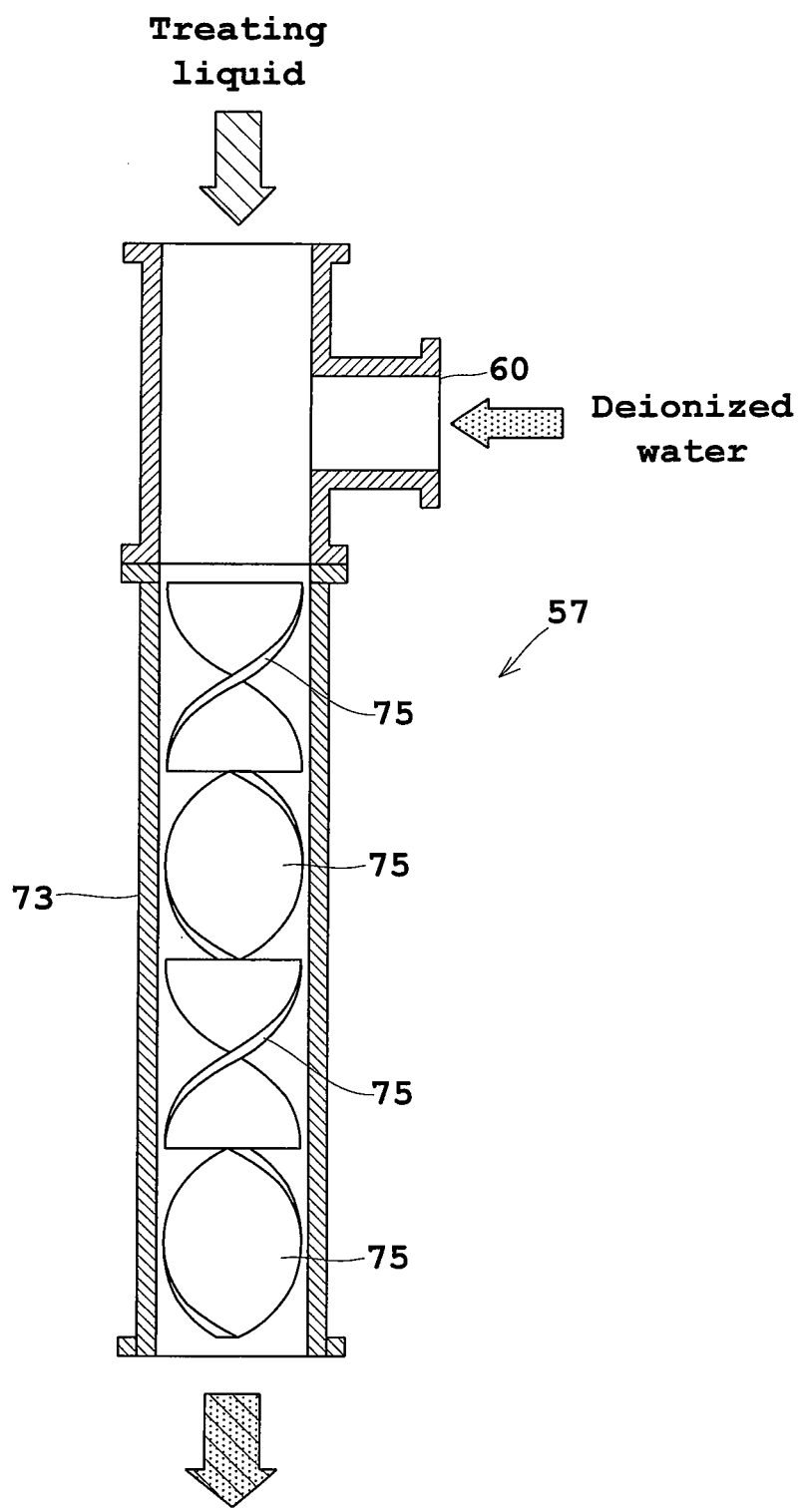
FIG. 2 is a view in vertical section showing an outline of a static mixer.

Next, reference is made to FIG. 2 which is a view in vertical section showing an outline of the static mixer 57.

The static mixer 57 includes a body portion 73 and a plurality of elements 75 arranged in the body portion 73. Each element 75 is in the form of a rectangular plate member twisted 180 degrees. Adjoining elements 75 are twisted in opposite directions. The static mixer 57 has the above-noted injection portion 60 disposed in the upstream position thereof for injecting deionized water into the treating liquid, and agitates and mixes these liquids by action of division, turning and reversal. Particularly where the solvent is water-insoluble such as HFE (hydrofluoroether) that does not dissolve completely in deionized water, the deionized water can be separated efficiently by passing the mixture through the oil-water separation filter 51 after mixing deionized water and solvent in the static mixer 57.

Figure 3:
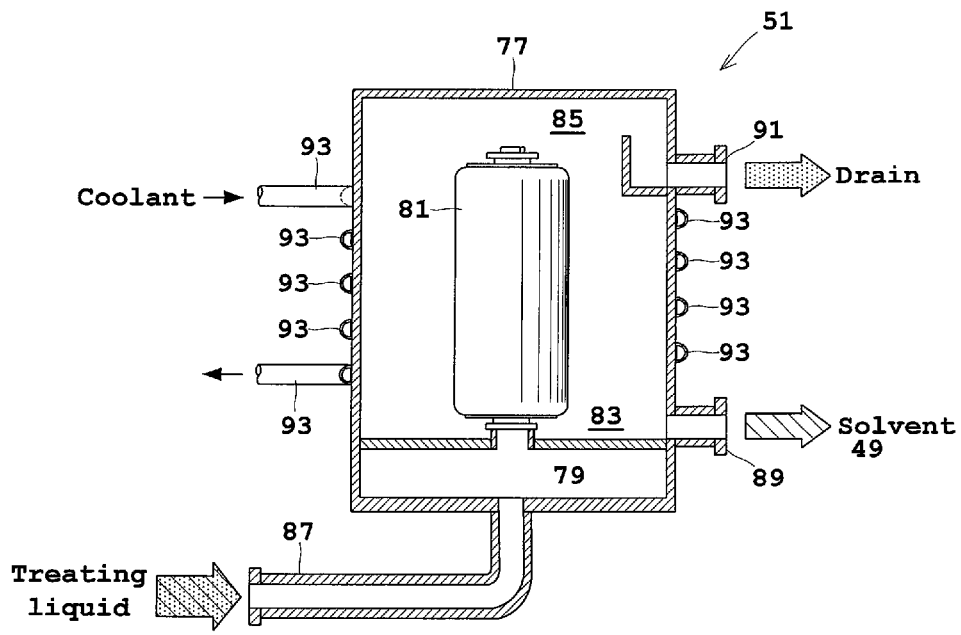
FIG. 3 is a view in vertical section showing an outline of an oil-water separation filter.

Next, reference is made to FIG. 3 which is a view in vertical section showing an outline of the oil-water separation filter 51.

The oil-water separation filter 51 includes a housing 77, a liquid introducing portion 79 in the bottom of the housing 77, a filter 81 for filtering the treating liquid from the liquid introducing portion 79, a first storage portion 83 for storing part having a high specific gravity of the liquid having passed the filter 81, a second storage portion 85 for storing part having a low specific gravity, an inflow portion 87 through which the treating liquid flows into the liquid introducing portion 79, a first discharge portion 89 for discharging the liquid from the first storage portion 83, a second discharge portion 91 for discharging the liquid from the second storage portion 85, and a cooling pipe 93 arranged along the outer wall of housing 77 for indirectly cooling the filter 81. The inflow portion 87 is located upstream with respect to the first branch pipe 49, and the first discharge portion 89 downstream with respect to the first branch pipe 49. The filter 81 is a microfiber filter having a function to trap a differentiated free liquid and flocculate the liquid into coarse masses. The free liquid differentiated to the order of microns is flocculated to the order of millimeters, thereby to be instantaneously distributed into a perfect bilayer system by specific gravity difference.

The above first discharge portion 89 corresponds to the outflow portion in this invention. The second discharge portion 91 corresponds to the discharge portion in this invention. The cooling pipe 93 corresponds to the cooling device in this invention.

The inner tank 3 has a concentration meter 95 disposed in an upper position thereof for measuring a deionized water concentration in the treating liquid. The concentration meter 95 may be the infrared absorption type, for example.

A controller 97, which corresponds to the control device in this invention, performs an overall control of the apparatus including the vertical movement of the holding arm 7, operation and stopping of the pump 17, temperature control of the in-line heater 21, flow control of the flow control valves 31, 41 and 43, opening and closing of the control valve 27, switching control of the three-way valves 15 and 19, vibration control of the vibrator 47, opening and closing of the control valves 59, 63, 65, 67, 69 and 71, and flow control of the flow control valve 61.

The controller 97 controls the various components noted above to carry out a "deionized water cleaning process" for moving the holding arm 7 to the treating position and supplying deionized water as treating liquid, a "replacing process" for supplying a solvent (HFE or IPA) to the treating liquid to replace the deionized water with the solvent, and a "separating and removing process" for causing the oil-water separation filter 51 to remove deionized water from the treating liquid. When the deionized water concentration in the solvent falls to or below a first predetermined value, the controller 97 carries out an "adsorbing and removing process" for causing the adsorption filter 55 to adsorb and remove deionized water from the treating liquid (which will be described in detail hereinafter). Only when the deionized water concentration in the treating liquid (solvent) falls to or below a second predetermined value, the controller 97 operates the vibrator 47 to apply ultrasonic vibration, to replace the deionized water having entered the fine structures of wafers W with the solvent. However, where the solvent is water-insoluble and does not easily dissolve in deionized water (e.g. HFE), the "separating and removing process" is carried out by passing the treating liquid through the oil-water separation filter 51 after operating the static mixer 57 to agitate and mix the deionized water and solvent by action of division, turning and reversal, thereby improving the efficiency of separation by the oil-water separation filter 51.

For the first predetermined value noted above, it is preferable to confirm the saturation solubility of the solvent in the treating liquid, but the concentration meter 95 can be used as substitution. A specific value of the first predetermined value is 0.1[%] or less, for example. When the adsorbing and removing process is carried out while the deionized water concentration is still high, the adsorption filter 55 will lose water-adsorbing power in a short time, necessitating frequent changes of the adsorption filter 55. The first predetermined value is set in order to avoid such an inconvenience.

Figure 4:
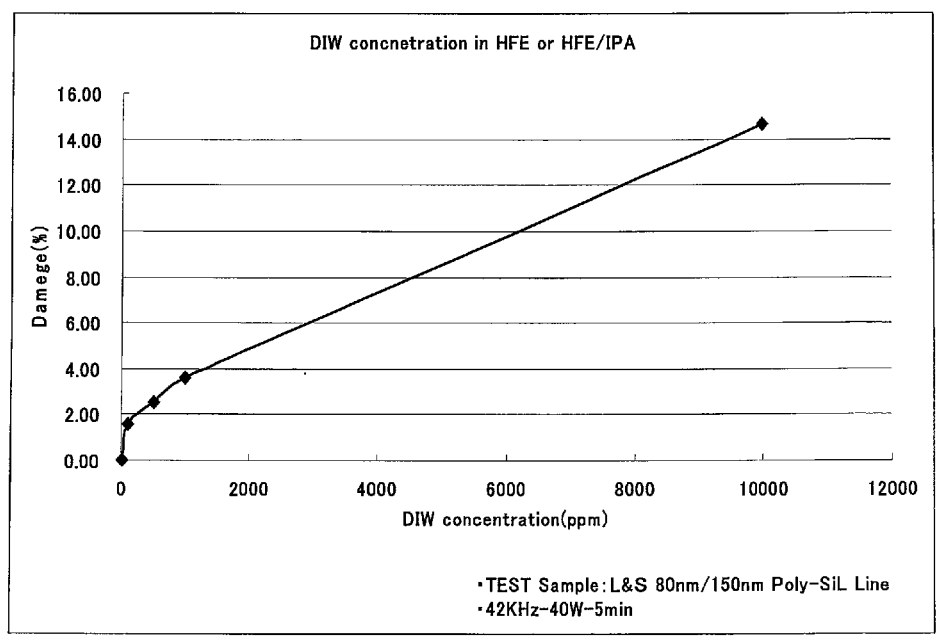
FIG. 4 is a graph showing deionized water concentration in a treating liquid and rate of damage to substrates.

The second predetermined value noted above corresponds to the solvent concentration in the treating liquid (a liquid mixture of deionized water and solvent) being 10,000 [ppm], for example. Inventors herein conducted an experiment in which wafers W with fine structures formed on surfaces thereof were immersed in a treating liquid in the inner tank 3, ultrasonic vibration was applied thereto while changing the concentration of the solvent (HFE or IPA) in the treating liquid, and damage to the fine structures on the wafers W was checked. The results are shown in FIG. 4. FIG. 4 is a graph showing deionized water concentration in the treating solution and rate of damage to the substrates. The experimental conditions at that time were that L&S (line & space) of the fine structures formed on the wafers W were 80 nm/150 nm, and the structures were formed of polysilicon. The ultrasonic vibration was 40 [W], 42 kHz and 5 [min].

Based on the results of the above experiment, Inventors have found that damage to the fine structures on the wafers W is within a permissible extent when the concentration of the solvent (HFE or IPA) in the treating liquid is 10,000 [ppm] or less. Thus, it is desirable that, in the above-noted series of processes including "deionized water cleaning process", ultrasonic vibration is applied only when the solvent concentration falls to or below the above-noted second predetermined value. This allows the solvent to replace also the deionized water having entered the fine structures on the wafers W, and besides the process can be carried out with little possibility of damage to the fine structures on the wafers W.

Figure 5:
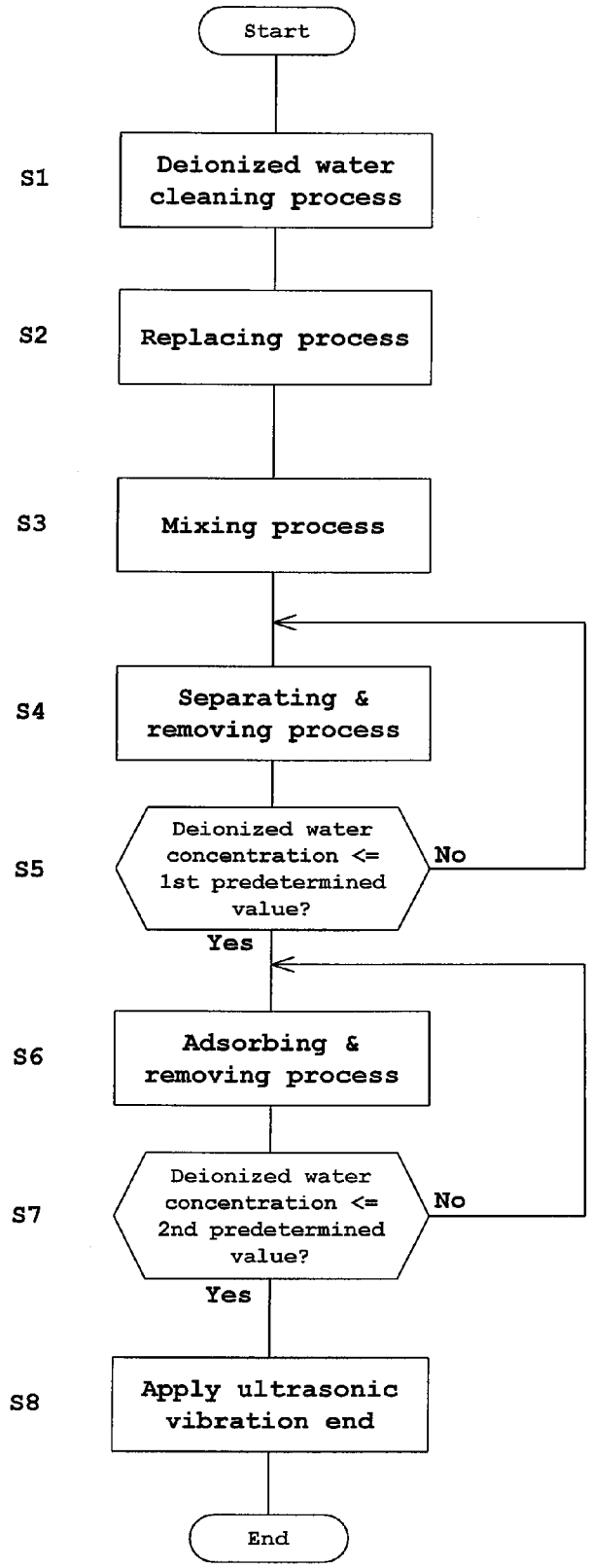
FIG. 5 is a flow chart of operation.

Next, operation of the above substrate treating apparatus will be described with reference to FIG. 5. FIG. 5 is a flow chart of operation.

Step S1

The controller 97 switches the three-way valve 15 to a position for allowing circulation, switches the three-way valve 19 to a position for communication with the supply pipe 11, opens the control valve 27, and adjusts the flow control valve 31 to supply deionized water in a predetermined flow rate from the deionized water source 25 through the injection pipe 23 and supply pipe 11 to the inner tank 3. After filling the inner tank 3, outer tank 5 and supply pipe 11 with deionized water, the controller 97 operates the pump 17 and in-line heater 21 to heat the deionized water to a predetermined temperature (e.g. 60° C.). After the predetermined temperature is reached, the controller 97 lowers the holding arm 7 from the standby position to the treating position, and maintains the holding arm 7 in the treating position for a predetermined time. As a result, the wafers W are cleaned with the deionized water heated to the predetermined temperature.

Step S2

The controller 97 stops the in-line heater 21 and pump 17, switches the three-way valve 15 to a drain position, and closes the flow control valve 31. The controller 97 adjusts the flow control valve 41 to a predetermined flow rate to supply HFE to the supply pipe 11. After the inner tank 3 and outer tank 5 are filled with HFE, the controller 97 switches the three-way valve 15 to the position for communication with the supply pipe 11, and operates the pump 17. As a result, a large part of deionized water in the treating liquid is discharged, and HFE is mixed into the treating liquid whereby the deionized water is replaced with the solvent.

Step S3

The controller 97 opens the control valves 63, 67 and 69, and switches the three-way valve 19 to a position for communication with the first branch pipe 49. As a result, the treating liquid passes through the oil-water separation filter 51 after water-insoluble HFE and deionized water are fully mixed by the static mixer 57.

At this time, the flow control valve 61 may be adjusted to inject deionized water into the treating liquid flowing through the static mixer 57. A deionized water concentration in the solvent below a certain value would lower the efficiency of the oil-water separation filter 51 separating deionized water and solvent. Deionized water is positively injected and mixed into the treating liquid having a reduced deionized water concentration, so that the oil-water separation filter 51 may separate deionized water below the certain value as drawn out by the injected deionized water.

Step S4

After executing above step S3 for a predetermined time, the controller 97 opens the control valve 59 to switch the channel to the third branch pipe 58, providing a bypass for the treating liquid to circumvent the static mixer 57. As a result, the treating liquid with a reduced deionized water concentration passes only through the oil-water separation filter 51.

The above step S4 may be skipped, and only step S3 may be executed.

Step S5

The controller 97 branches the process according to whether the deionized water concentration from the concentration meter 95 has the first predetermined value or less. Specifically, when the deionized water concentration exceeds the first predetermined value, step S4 is repeated. Otherwise, the operation proceeds to step S6.

Steps S6 and S7

The controller 97 opens the control valve 65, and closes the control valves 67 and 69. As a result, the treating liquid (largely HFE) with the deionized water concentration at the first predetermined value or less flows into the second branch pipe 53. A small quantity of deionized water remaining in the treating liquid is adsorbed and removed by the adsorption filter 55. The controller 97 continues the process of step S6 until the deionized water concentration falls to the second predetermined value or less. The operation moves to step S8 when the deionized water concentration falls to the second predetermined value or less.

Step S8

The controller 97 drives the vibrator 47 to apply ultrasonic vibration at a predetermined output to the treating liquid in the inner tank 3 for a predetermined time. As a result, the deionized water having entered the fine structures on the wafers W can be replaced with the treating liquid, i.e. HFE. Since the deionized water concentration in the treating liquid has been reduced to a minimal level, no damage is done to the fine structures on the wafers W.

According to this embodiment, as described above, the controller 97 first carries out the deionized water cleaning process for cleaning wafers W with deionized water, then the replacing process for injecting HFE and replacing the deionized water with HFE. The controller 97 switches the flow of the treating liquid to the first branch pipe 49 for the separating and removing process to remove the deionized water from the treating liquid with the oil-water separation filter 51, and then switches the flow of the treating liquid to the second branch pipe 53 for the adsorbing process by the adsorption filter 55. Consequently, the adsorption filter 55 can adsorb and remove only a trace quantity of deionized water remaining unremoved by the separating and removing process. In this way, the deionized water concentration in HFE is reduced to a minimal level. This prevents an unsatisfactory drying of the wafers W due to the deionized water in HFE.

The deionized water having entered the fine structures formed on the wafers W is not easily replaceable with HFE. The deionized water in the fine structures can be replaced with HFE by applying ultrasonic vibration from the vibrator 47. If the deionized water concentration in HFE is high, the fine structures on the wafers W may be damaged. Such an inconvenience is avoided by applying ultrasonic wave after the deionized water concentration in HFE falls to the predetermined value or less. This achieves improved yield.

This invention is not limited to the foregoing embodiment, but may be modified as follows:

(1) The foregoing embodiment provides the static mixer 57 for fully mixing the water-insoluble solvent with deionized water prior to passage through the oil-water separation filter 51. Where a water-soluble solvent is used, there is no need for the static mixer 57. This simplifies the apparatus construction.

(2) The foregoing embodiment provides the vibrator 47 attached to the inner tank 3. This component may be omitted where no ultrasonic vibration is applied. This simplifies the apparatus construction.

(3) The foregoing embodiment uses, by way of example, fluoric HFE as water-insoluble solvent, and IPA as water-soluble solvent. This invention is applicable to other solvents. It is possible to use, for example, HFC (hydrofluorocarbon) as fluoric solvent other than HFE.

(4) The foregoing embodiment provides the concentration meter 95 mounted in the inner tank 3 for measuring deionized water concentration. This construction may be modified to measure deionized water concentration in the treating liquid circulating through the supply pipe 11.

Embodiment 2

Figure 6:
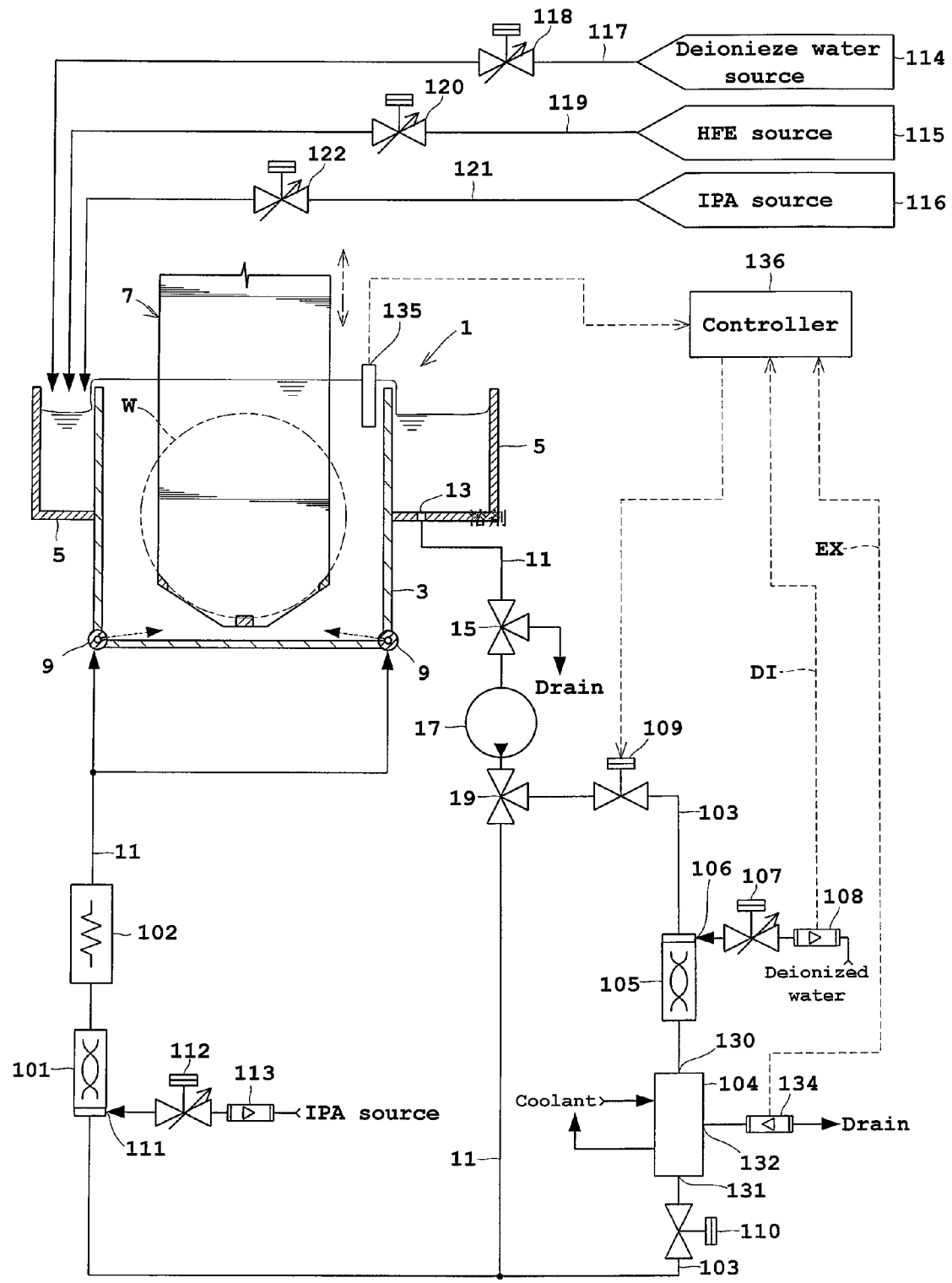
FIG. 6 is a block diagram showing an outline of a substrate treating apparatus in Embodiment 2.

FIG. 6 is a block diagram showing an outline of a substrate treating apparatus in Embodiment 2.

A treating tank 1 includes an inner tank 3 and an outer tank 5. The inner tank 3 stores a treating liquid or solution, and can receive wafers W held by a holding arm 7. The holding arm 7 includes support elements arranged on lower positions of an arm portion for contacting lower edges of the wafers W and supporting the wafers W in upstanding posture. The holding arm 7 is vertically movable between a "treating position" inside the inner tank 3 and a "standby position" above the inner tank 3. The inner tank 3 stores deionized water, solvents or a mixture thereof as a treating liquid or solution, and the treating liquid overflowing the inner tank 3 is collected in the outer tank 5 surrounding an upper portion of the inner tank 3. The inner tank 3 has two jet pipes 9 disposed at opposite sides in the bottom thereof for supplying the treating liquid into the inner tank 3.

The jet pipes 9 are connected to one end of a supply pipe 11 having the other end connected to a drain port 13 formed in the outer tank 5. The supply pipe 11 has a three-way valve 15, a pump 17, a three-way valve 19, a static mixer 101 and an in-line heater 102 arranged in order from upstream, i.e. adjacent the outer tank 5. The three-way valve 15 is switchable between circulation and drain of the treating liquid. The pump 17 circulates the treating liquid, and the three-way valve 19 is switchable between circulation of the treating liquid and removal of deionized water (to be described in detail hereinafter). The in-line heater 102 heats the treating liquid circulating through the supply pipe 11 to a predetermined temperature.

The supply pipe 11 has a branch pipe 103 shunted therefrom at the three-way valve 19. The first branch pipe 103 has an oil-water separation filter 104 for separating the deionized water and solvent in the treating solution.

The oil-water separation filter 104 corresponds to the deionized water removing device in this invention.

The branch pipe 103 noted above has a static mixer 105 disposed upstream of the oil-water separation filter 104. The static mixer 105 has an injection portion 106 disposed in an upstream position thereof for injecting deionized water into the treating liquid circulating through the branch pipe 103, and a flow control valve 107 for controlling a flow rate of deionized water to the injection portion 106. A flowmeter 108 is disposed upstream of the flow control valve 107 for measuring the flow rate of deionized water. As described in detail hereinafter, the static mixer 105 has no actuator, but agitates and mixes fluids by action of division, turning and reversal. A control valve 109 is disposed between the three-way valve 19 and branch pipe 103. The branch pipe 103 has a control valve 110 disposed in the most downstream position.

The static mixer 105 corresponds to the first mixer in this invention. The static mixer 101 corresponds to the second mixer in this invention. The injection portion 106 corresponds to the deionized water injecting device in this invention.

The static mixer 101, as does the static mixer 105 described above, has an injection portion 111 disposed in an upstream position thereof for injecting IPA (isopropyl alcohol) into the treating liquid circulating through the supply pipe 11. The injection portion 111 has a flow control valve 112 for controlling an injection flow rate. A flowmeter 113 is disposed upstream of the flow control valve 112 for measuring the flow rate of IPA from the IPA source.

The above injection portion 111 corresponds to the solvent injecting device in this invention.

A deionized water source 114, an HFE source 115 and an IPA source 116 are provided for supplying deionized water, HFE (hydrofluoroether) and IPA (isopropyl alcohol) to the outer tank 5. The deionized water source 114 supplies deionized water to the outer tank 5 through a supply pipe 117. Its flow rate is controlled by a flow control valve 118 mounted on the supply pipe 117. The HFE source 115 supplies HFE to the outer tank 5 through a supply pipe 119. Its flow rate is controlled by a flow control valve 120 mounted on the supply pipe 119. The IPA source 116 supplies IPA to the outer tank 5 through a supply pipe 121. Its flow rate is controlled by a flow control valve 122 mounted on the supply pipe 121.

The deionized water source 114 and supply pipe 117 correspond to the deionized water supply device in this invention. The HFE source 115, IPA source 116 and supply pipes 119 and 121 correspond to the solvent supply device in this invention.

Figure 7:
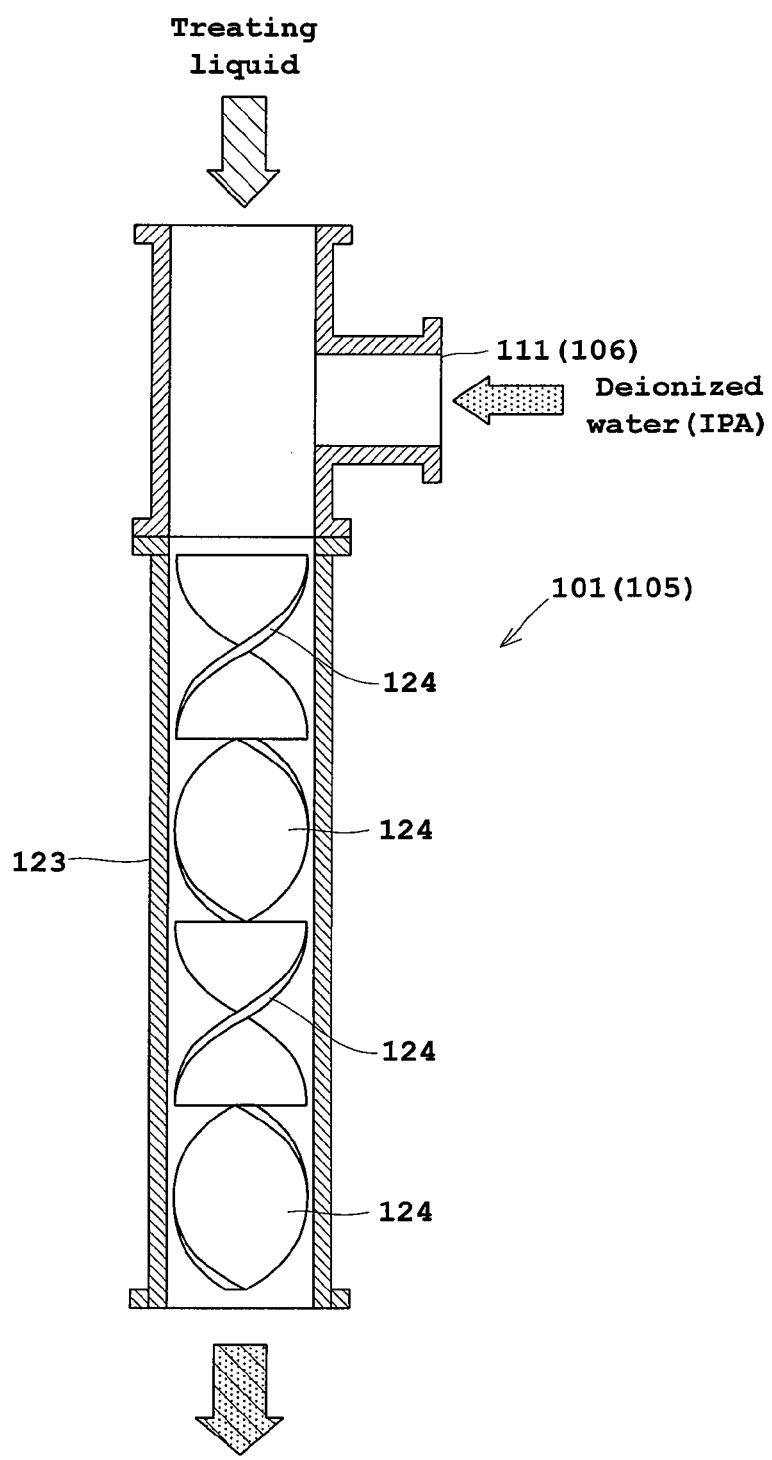
FIG. 7 is a view in vertical section showing an outline of a static mixer.

Next, reference is made to FIG. 7 which is a view in vertical section showing an outline of the static mixers 101 and 105 which are identical in construction.

The static mixer 101 (105) includes a cylindrical body portion 123 and a plurality of elements 124 arranged in the body portion 123. Each element 124 is in the form of a rectangular plate member twisted 180 degrees. Adjoining elements 124 are twisted in opposite directions. The static mixer 101 (105) has the above-noted injection portion 111 (106) disposed in the upstream position thereof for injecting IPA (deionized water) into the treating liquid, and agitates and mixes these liquids by action of division, turning and reversal. Particularly where the solvent is water-insoluble such as HFE (hydrofluoroether) that does not dissolve completely in deionized water, deionized water can be separated efficiently by passing the mixture through the oil-water separation filter 104 after mixing deionized water and solvent in the static mixer 105.

Figure 8:
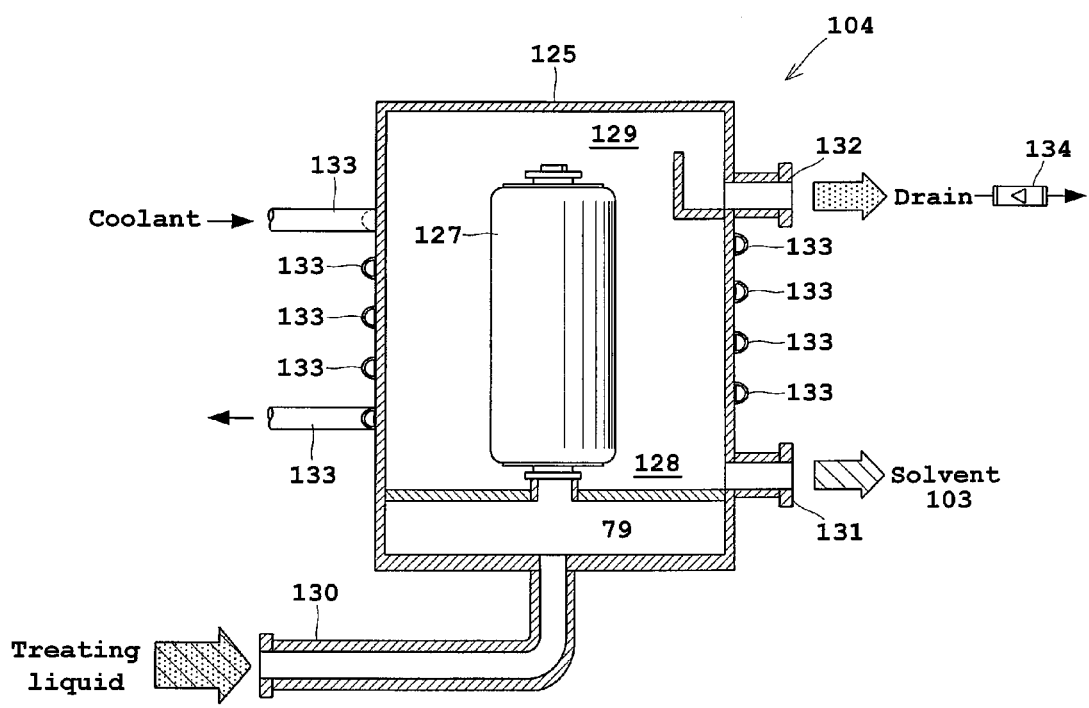
FIG. 8 is a view in vertical section showing an outline of an oil-water separation filter.

Next, reference is made to FIG. 8 which is a view in vertical section showing an outline of the oil-water separation filter 104.

The oil-water separation filter 104 includes a housing 125, a liquid introducing portion 126 in the bottom of the housing 125, a filter 127 for filtering the treating liquid from the liquid introducing portion 126, a first storage portion 128 for storing part having a high specific gravity of the liquid having passed through the filter 127, a second storage portion 129 for storing part having a low specific gravity, an inflow portion 130 through which the treating liquid flows into the liquid introducing portion 126, a first discharge portion 131 for discharging the liquid from the first storage portion 128, a second discharge portion 132 for discharging the liquid from the second storage portion 129, and a cooling pipe 133 arranged along the outer wall of housing 125 for indirectly cooling the filter 127. The inflow portion 130 is located upstream with respect to the branch pipe 103, and the first discharge portion 131 downstream with respect to the branch pipe 103. The filter 127 is a microfiber filter having a function to trap a differentiated free liquid and flocculate the liquid into coarse masses. The free liquid differentiated to the order of microns is flocculated to the order of millimeters, thereby to be instantaneously distributed into a perfect bilayer system by specific gravity difference. The second discharge portion 132 has a flowmeter 134 attached thereto for measuring a discharge flow rate.

By circulating a coolant through the above cooling pipe 133, the deionized water and solvent can separated with increased efficiency. This is because solubility of the deionized water in the solvent is made the lower at the lower temperature.

The above first discharge portion 131 corresponds to the outflow portion in this invention. The second discharge portion 132 corresponds to the discharge portion in this invention. The cooling pipe 133 corresponds to the cooling device in this invention.

The inner tank 3 has a concentration meter 135 disposed in an upper position thereof for measuring a deionized water concentration in the treating liquid. The concentration meter 135 may be the infrared absorption type, for example.

A controller 136, which corresponds to the control device in this invention, performs an overall control of the apparatus including the vertical movement of the holding arm 7, operation and stopping of the pump 17, temperature control of the in-line heater 102, flow control of the flow control valves 107, 112, 118, 120 and 122, opening and closing of the control valves 109 and 110, and switching control of the three-way valves 15 and 19. The flow rates measured by the flowmeters 108, 113 and 134 are inputted to the controller 136.

The controller 136 controls the various components noted above to carry out a "deionized water cleaning process" by moving the holding arm 7 to the treating position and supplying deionized water as treating liquid, and a "replacing process" by supplying a solvent (HFE or IPA) to the treating liquid to replace the deionized water with the solvent. The controller 136 carries out also a "deionized water removing process" for causing the oil-water separation filter 104 to remove deionized water from the treating liquid (to be described in detail hereinafter). Only when the deionized water concentration in the treating liquid (solvent) falls to or below a predetermined value, the controller 136 carries out a solvent replenishing operation. Where the solvent is water-insoluble (e.g. HFE) and does not easily dissolve in deionized water, the "deionized water removing process" is carried out by passing the treating liquid through the oil-water separation filter 104 after operating the static mixer 105 to agitate and mix the deionized water and solvent by action of division, turning and reversal, thereby improving the efficiency of separation by the oil-water separation filter 104.

The predetermined value noted above corresponds to the solvent concentration in the treating liquid (a liquid mixture of deionized water and solvent) being 10,000 [ppm], for example.

Figure 9:
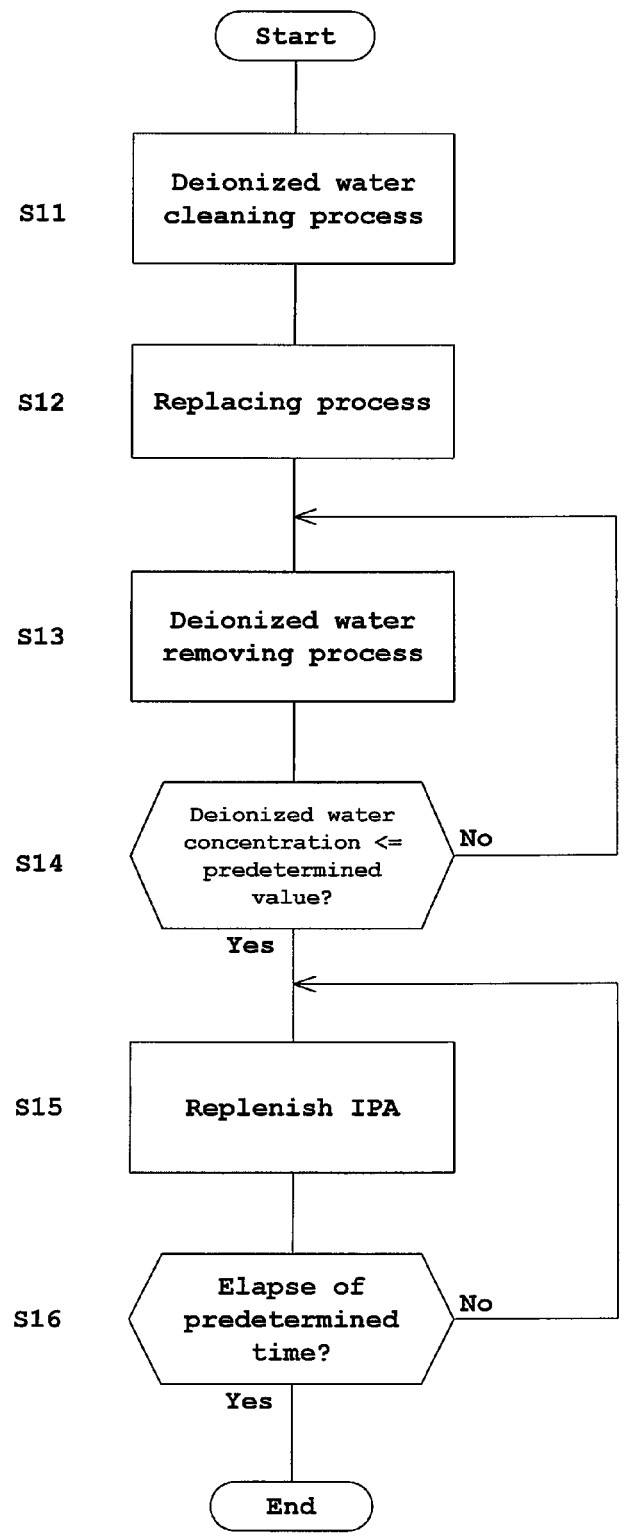
FIG. 9 is a flow chart of operation.

Next, operation of the above substrate treating apparatus will be described with reference to FIG. 9. FIG. 9 is a flow chart of operation.

Step S11

The controller 136 switches the three-way valve 15 to a position for allowing circulation, switches the three-way valve 19 to a position for communication with the supply pipe 11, and adjusts the flow control valve 118 to supply deionized water in a predetermined flow rate from the deionized water source 114 to the outer tank 5. After filling the inner tank 3, outer tank 5 and supply pipe 11 with deionized water, the controller 136 operates the pump 17 and in-line heater 102 to heat the deionized water to a predetermined temperature (e.g. 60° C.). After the predetermined temperature is reached, the controller 136 lowers the holding arm 7 from the standby position to the treating position, maintains the holding arm 7 in the treating position for a predetermined time. As a result, the wafers W are cleaned with the deionized water heated to the predetermined temperature.

Step S12

The controller 136 stops the pump 17, switches the three-way valve 15 to a drain position, and closes the flow control valve 118. The controller 136 adjusts the flow control valve 120 to supply HFE in a predetermined flow rate to the outer tank 5. After the inner tank 3 and outer tank 5 are filled with HFE, the controller 136 switches the three-way valve 15 to the position for communication with the supply pipe 11, and operates the pump 17. As a result, a large part of deionized water in the treating liquid is discharged, and HFE is mixed into the treating solution whereby the deionized water is replaced with the solvent. Next, the controller 136 closes the flow control valve 120, and opens the flow control valve 122 to supply IPA to the outer tank 5, thereby forming a treating liquid including HFE and IPA.

Step S13

The controller 136 switches the three-way valve 19 to a position for communication with the branch pipe 103. As a result, the treating liquid passes through the oil-water separation filter 104 after HFE/IPA and deionized water are fully mixed by the static mixer 105. Thus, the deionized water is separated from the treating liquid largely made up of HFE/IPA, and is discharged from the second discharge portion 132.

At this time, the flow control valve 107 may be adjusted to inject deionized water into the treating liquid flowing through the static mixer 105. A deionized water concentration in the treating liquid below a certain value would lower the efficiency of the oil-water separation filter 104 separating deionized water and solvent. Deionized water is positively injected and mixed into the treating liquid having a reduced deionized water concentration, so that the oil-water separation filter 104 may separate deionized water below the certain value as drawn out by the injected deionized water. The oil-water separation filter 104, when removing the deionized water, will remove a certain amount of water-soluble IPA along with the deionized water.

Step S14

With start of the above deionized water removing process, the controller 136 receives one output signal after another from the concentration meter 135 to determine a deionized water concentration in the treating liquid. Step S13 is repeated until the deionized water concentration in the treating liquid becomes 1,000 ppm or less, for example. That is, deionized water removal is carried out until the deionized water becomes a predetermined concentration. The deionized water having entered the fine structures on the wafers W gradually joins the treating liquid, causing a temporary phenomenon of the deionized water concentration increasing gradually.

Step S15

When the deionized water concentration in the treating liquid falls below a predetermined value, the deionized water removing efficiency of the oil-water separation filter 104 will lower. Thus, the controller 136 adjusts the flow control valve 107 to inject deionized water through the injection portion 106 to maintain the deionized water removal efficiency as if with a nose medicine. At this time, the solvent concentration in the treating liquid may be kept constant by making substantially zero the sum of the injection rate II of the solvent through the injection portion 111, and the difference between the injection rate DI of deionized water outputted from the flowmeter 108 and quantity EX of the treating liquid (solvent and deionized water) removed by the oil-water separation filter 104.

Step S16

The controller 136 checks passage of time with a timer not shown, and repeats step S15 until elapse of a predetermined time. This process allows the solvent to replace fully the deionized water oozing from the fine structures on the wafers W.

Through the above series of processes, the wafers W are cleaned with deionized water, and the deionized water is fully replaced with the solvents (HFE/IPA). Subsequently, the holding arm 7 is pulled up to the standby position to finish the cleaning treatment of the wafers W.

As described above, the controller 136 carries out the replacing process for supplying HFE/IPA to replace deionized water with the solvents after the deionized water cleaning process. Then, the controller 136 carries out the deionized water removing process by switching to the branch pipe 103, and causing the oil-water separation filter 104 to remove deionized water from the treating liquid. Thus, insufficient drying and collapse of the fine structures can be prevented by removing the deionized water in the treating liquid replaced with HFE/IPA as much as possible. Not only the deionized water in the treating liquid but a certain amount of IPA also is removed through the deionized water removing process, thereby decreasing the treating liquid including HFE/IPA. However, IPA is replenished through the injection portion 106 to compensate for the loss in quantity of the solvent accompanying the deionized water removal.

This invention is not limited to the foregoing embodiment, but may be modified as follows:

(1) The foregoing embodiment provides the static mixers 101 and 116 for fully mixing the solvents with deionized water. Where a water-soluble solvent is a main component, the static mixers 101 and 116 may be omitted. This simplifies the apparatus construction.

(2) The foregoing embodiment provides the oil-water separation filter 104 as deionized water removing device. Instead, a deionized water adsorbing device (adsorption filter) may be employed which is formed of a molecular sieve, activated carbon, alumina or the like for adsorbing and removing even a trace quantity of deionized water from the treating liquid. The oil-water separation filter 104 and deionized water adsorbing device may be arranged in parallel and to be switchable for use. This construction can use the characteristic of each to remove deionized water efficiently.

(3) The foregoing embodiment uses, by way of example, fluoric HFE as water-insoluble solvent, and IPA as water-soluble solvent. This invention is applicable to other solvents. It is possible to use, for example, HFC (hydrofluorocarbon) as fluoric solvent other than HFE.

(4) The foregoing embodiment provides the concentration meter 135 mounted in the inner tank 3 for measuring deionized water concentration. This construction may be modified to measure deionized water concentration in the treating liquid circulating through the supply pipe 11.

(5) The foregoing embodiment employs the construction for supplying deionized water and solvents to the outer tank 5. Instead, for example, deionized water and solvents may be supplied directly into the supply pipe 11.

Embodiment 3

Figure 10:
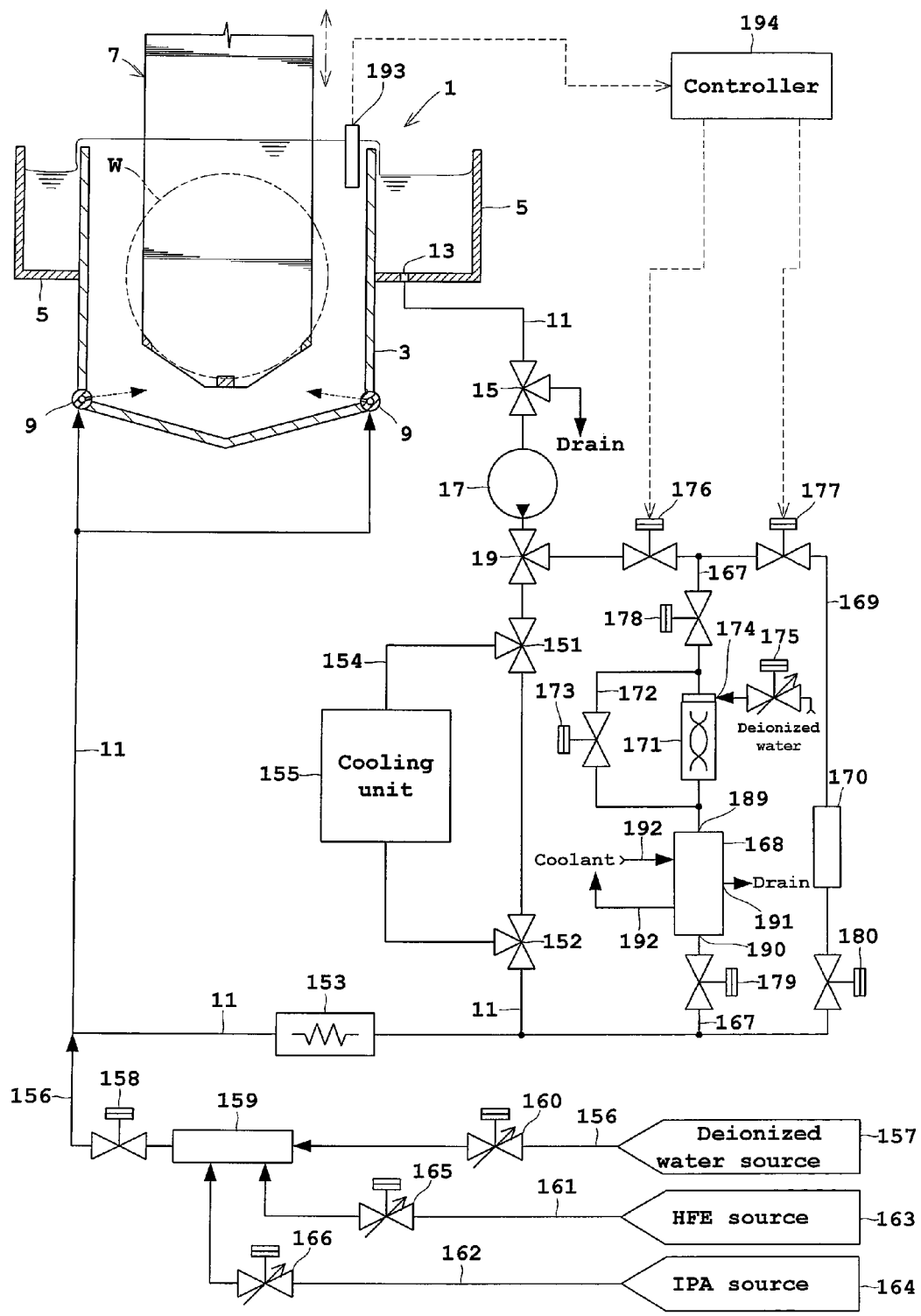
FIG. 10 is a block diagram showing an outline of a substrate treating apparatus in Embodiment 3.

FIG. 10 is a block diagram showing an outline of a substrate treating apparatus in Embodiment 3.

The substrate treating apparatus in this embodiment includes a treating tank 1. The treating tank 1 includes an inner tank 3 and an outer tank 5. The inner tank 3 stores a treating liquid or solution, and can receive wafers W held by a holding arm 7. The holding arm 7 includes support elements arranged on lower positions of an arm portion for contacting lower edges of the wafers W and supporting the wafers W in upstanding posture. The holding arm 7 is vertically movable between a "treating position" inside the inner tank 3 and a "standby position" above the inner tank 3. The inner tank 3 stores deionized water, solvents or a mixture thereof as a treating liquid or solution, and the treating liquid overflowing the inner tank 3 is collected in the outer tank 5 surrounding an upper portion of the inner tank 3. The inner tank 3 has two jet pipes 9 disposed at opposite sides in the bottom thereof for supplying the treating liquid into the inner tank 3.

The jet pipes 9 are connected to one end of a supply pipe 11 having the other end connected to a drain port 13 formed in the outer tank 5. The supply pipe 11 has a three-way valve 15, a pump 17, three-way valves 19, 151 and 152 and an in-line heater 153 arranged in order from upstream, i.e. adjacent the outer tank 5. The three-way valve 15 is switchable between circulation and drain of the treating liquid. The pump 17 circulates the treating liquid, and the three-way valve 19 is switchable between circulation of the treating liquid and removal of deionized water (to be described in detail hereinafter). The three-way valves 151 and 152 are switchable between circulation and cooling of the treating liquid. The in-line heater 153 heats the treating liquid circulating through the supply pipe 11 to a predetermined temperature.

The three-way valves 151 and 152 have a first branch pipe 154 connected thereto and shunted from the supply pipe 11. The first branch pipe 154 has a cooling unit 155 mounted thereon. The cooling unit 155 has a function to cool the treating liquid circulating through the first branch pipe 154 to a predetermined temperature.

The cooling unit 155 corresponds to the "cooling device" in this invention.

The supply pipe 11 has one end of an injection pipe 156 connected to a position thereof downstream of the in-line heater 153 and upstream of the jet pipes 9. The other end of the injection pipe 156 is connected to a deionized water source 157. The injection pipe 156 has a control valve 158, a mixing valve 159 and a flow control valve 160 arranged in order from downstream to upstream. The control valve 158 controls supply and cutoff of deionized water, solvents or a treating solution of the solvents in deionized water. The mixing valve 159 has, connected thereto, one end of each of two chemical pipes 161 and 162, with the other ends thereof connected to an HFE source 163 and an IPA source 164, respectively. The two chemical pipes 161 and 162 have flow control valves 165 and 166 for adjusting flow rate, respectively. The mixing valve 159 has a function to mix HFE (hydrofluoroether), which is a water-insoluble fluoric solvent, and/or water-soluble IPA (isopropyl alcohol).

The mixing valve 159 corresponds to the "water-soluble solvent injecting device" and "water-insoluble solvent injecting device" in this invention.

The supply pipe 11 has a second branch pipe 167 connected to the three-way valve 19 upstream of the cooling unit 155 and to the three-way valve 152 downstream of the cooling unit 155. The second branch pipe 167 has an oil-water separation filter 168 for separating the deionized water and solvent in the treating liquid. The supply pipe 11 further includes a third branch pipe 169 extending parallel to the second branch pipe 167. The third branch pipe 169 communicates with the second branch pipe 167 in positions upstream and downstream of the oil-water separation filter 168. The third branch pipe 169 has an adsorption filter 170 for adsorbing and removing deionized water from the treating liquid. The adsorption filter 170 is formed of a molecular sieve, activated carbon, alumina or the like, and has a function to adsorb and remove even a trace quantity of deionized water from the treating liquid.

The second branch pipe 167 noted above has a static mixer 171 disposed upstream of the oil-water separation filter 168. A fourth branch pipe 172 communicates with the second branch pipe 167 in positions upstream of this static mixer 171, and downstream of the static mixer 171 and upstream of the oil-water separation filter 168. The fourth branch pipe 172 includes a control valve 173 for controlling circulation therethrough. The static mixer 171 has an injection portion 174 disposed in an upstream position thereof for injecting deionized water into the treating liquid circulating through the second branch pipe 167. A flow control valve 175 is provided for controlling a flow rate of deionized water to the injection portion 174. As described in detail hereinafter, the static mixer 171 has no actuator, but agitates and mixes fluids by action of division, turning and reversal.

A control valve 176 is disposed between the three-way valve 19 and second branch pipe 167, and a control valve 177 is mounted on the third branch pipe 169. The second branch pipe 167 has a control valve 178 disposed in the most upstream position thereof, and a control valve 179 in the most downstream position. The third branch pipe 169 has a control valve 180 disposed downstream of the adsorption filter 170.

The oil-water separation filter 168 corresponds to the "separating device" in this invention. The adsorption filter 170 corresponds to the "deionized water removing device" in this invention. The static mixer 171 corresponds to the "mixer" in this invention.

Figure 11:
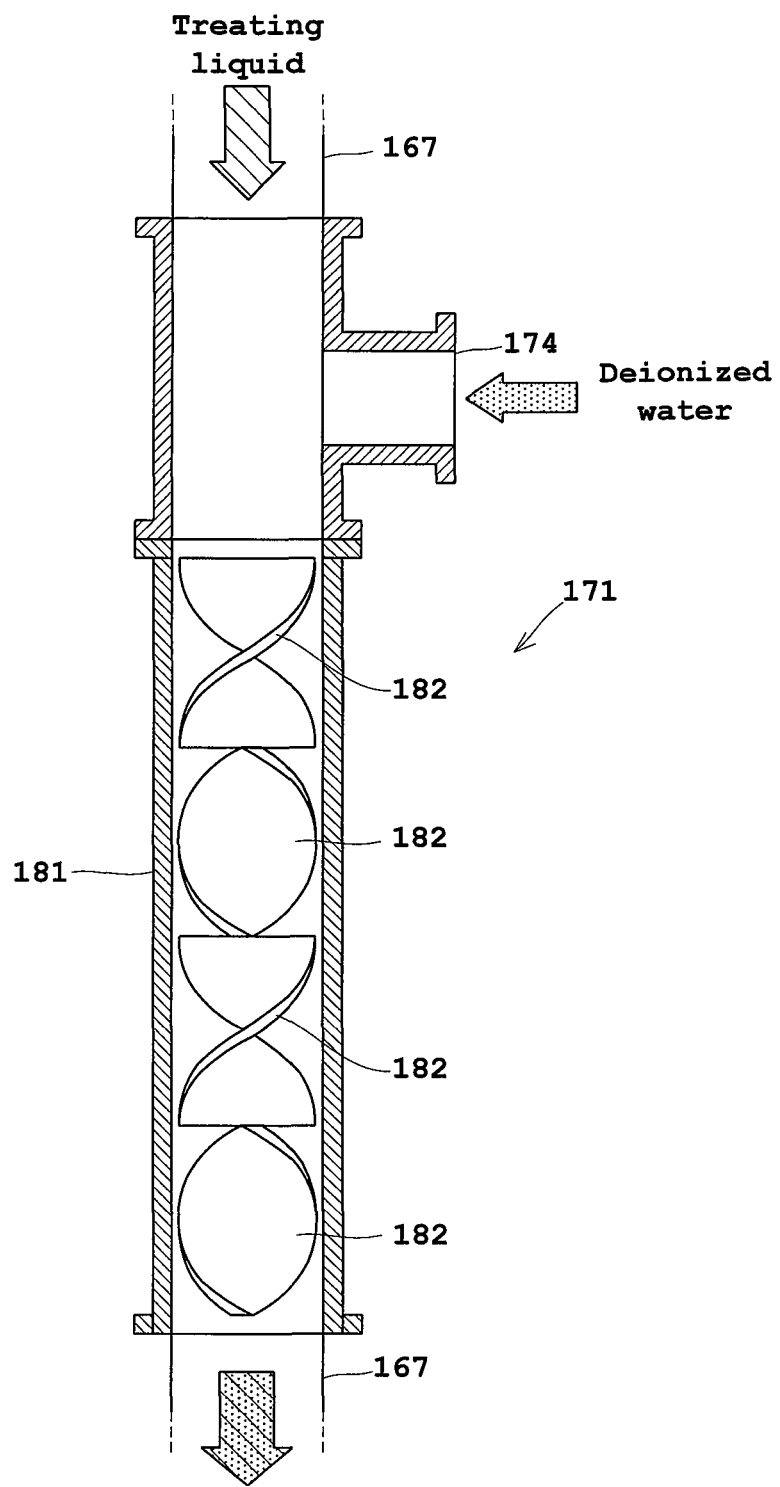
FIG. 11 is a view in vertical section showing an outline of a static mixer.

Next, reference is made to FIG. 11 which is a view in vertical section showing an outline of the static mixer 171.

The static mixer 171 includes a body portion 181 and a plurality of elements 182 arranged in the body portion 181. Each element 182 is in the form of a rectangular plate member twisted 180 degrees. Adjoining elements 182 are twisted in opposite directions. The static mixer 171 has the above-noted injection portion 174 disposed in the upstream position thereof for injecting deionized water into the treating liquid, and agitates and mixes these liquids by action of division, turning and reversal. Particularly where the solvent is water-insoluble such as HFE (hydrofluoroether) that does not dissolve completely in deionized water, the deionized water can be separated efficiently by passing the mixture through the oil-water separation filter 168 after mixing deionized water and solvent in the static mixer 171.

Figure 12:
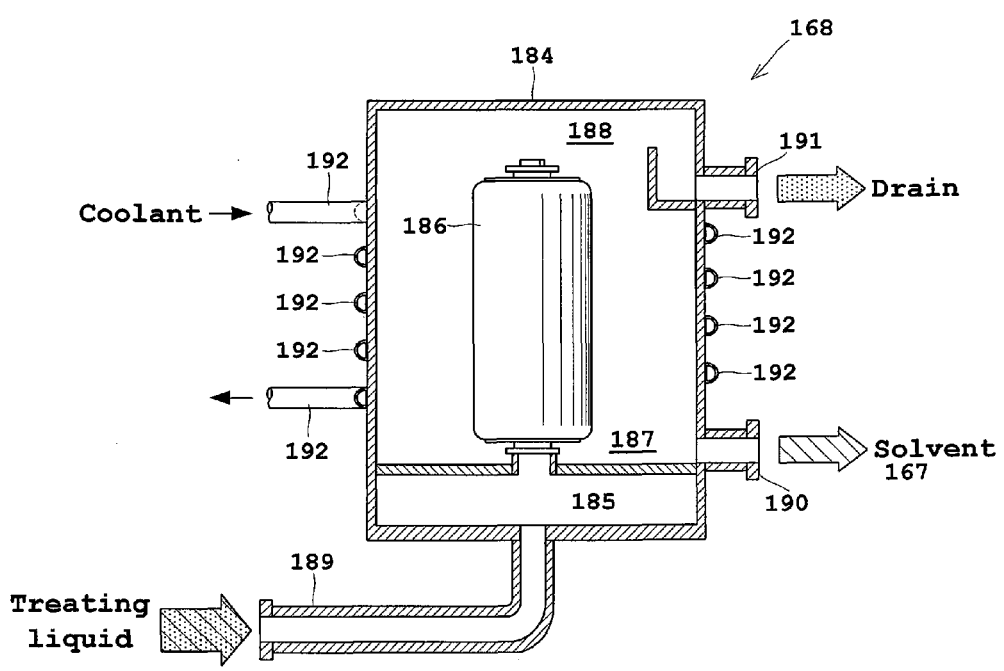
FIG. 12 is a view in vertical section showing an outline of an oil-water separation filter.

Next, reference is made to FIG. 12 which is a view in vertical section showing an outline of the oil-water separation filter 168.

The oil-water separation filter 168 includes a housing 184, a liquid introducing portion 185 in the bottom of the housing 184, a filter 186 for filtering the treating liquid from the liquid introducing portion 185, a first storage portion 187 for storing part having a high specific gravity of the liquid having passed the filter 186, a second storage portion 188 for storing part having a low specific gravity, an inflow portion 189 through which the treating liquid flows into the liquid introducing portion 185, a first discharge portion 190 for discharging the liquid from the first storage portion 187, a second discharge portion 191 for discharging the liquid from the second storage portion 188, and a cooling pipe 192 arranged along the outer wall of housing 184 for indirectly cooling the filter 186. The inflow portion 189 is located upstream with respect to the second branch pipe 167, and the first discharge portion 190 downstream with respect to the second branch pipe 167. The filter 186 is a microfiber filter having a function to trap a differentiated free liquid and flocculate the liquid into coarse masses. The free liquid differentiated to the order of microns is flocculated to the order of millimeters, thereby to be instantaneously distributed into a perfect bilayer system by specific gravity difference. The efficiency of oil-water separation can be improved by cooling the cooling filter 186 with the cooling pipe 192.

The inner tank 3 has a concentration meter 193 disposed in an upper position thereof for measuring a deionized water concentration in the treating liquid. The concentration meter 193 may be the infrared absorption type, for example.

A controller 194, which corresponds to the "control device" in this invention, performs an overall control of the apparatus including the vertical movement of the holding arm 7, operation and stopping of the pump 17, temperature control of the in-line heater 153, flow control of the flow control valves 160, 165, 166 and 175, opening and closing of the control valve 158, switching control of the three-way valves 15, 19, 151 and 152, and opening and closing of the control valves 173, 176, 177, 179 and 180.

The controller 194 controls the various components noted above to carry out a "deionized water cleaning process" for moving the holding arm 7 to the treating position and supplying deionized water as treating liquid, a "replacing process" for supplying the water-soluble solvent (IPA) to deionized water to replace the deionized water with the water-soluble solvent, a "cooling process" for causing the cooling unit 155 to cool the treating liquid, and a "separating and removing process" for causing the oil-water separation filter 168 to remove deionized water from the treating liquid. Subsequently, the controller 194 carries out an "adsorbing and removing process" for causing the adsorption filter 170 to adsorb and remove deionized water from the treating liquid. Then, the controller 194 carries out a "replacement promoting process" for injecting the water-insoluble solvent into the treating liquid to replace the water-soluble solvent with the water-insoluble solvent. When the deionized water concentration in the treating liquid falls to or below a predetermined value, the controller 194 carries out a "finishing process" for injecting a small quantity (e.g. about 5 to 10%) of water-soluble solvent again, and causing the adsorption filter 170 to further adsorb and remove deionized water from the treating liquid. However, during the "replacing process" and "separating and removing process", the treating liquid is passed through the oil-water separation filter 168 after operating the static mixer 171 to agitate and mix the deionized water and solvent by action of division, turning and reversal, thereby improving the efficiency of separation by the oil-water separation filter 168. The static mixer 171 is effective particularly where the solvent is water-insoluble and does not easily dissolve in deionized water. After the "finishing process", a solvent is sprayed from a nozzle, not shown, to form a solvent atmosphere, and the holding arm 7 is pulled up from the treating tank 1 to dry the wafers W.

It is preferable to confirm the saturation solubility of the solvent in the treating liquid before the "adsorbing and removing process", but the concentration meter 193 can be used as substitution. A specific value of deionized water concentration is 0.1[%] or less, for example. When the "adsorbing and removing process" is carried out while the deionized water concentration is still high, the adsorption filter 170 will lose water-adsorbing power in a short time, necessitating frequent changes of the adsorption filter 170. It is desirable to avoid such an inconvenience.

In the "replacement promoting process", preferably, the controller 194 operates the flow control valve 165 to inject the water-insoluble solvent at a low flow rate. Then, the inner tank 3 may be filled with the water-insoluble solvent while maintaining an interface with the water-soluble solvent stored in the inner tank 3. This ensures an efficient replacement of the water-soluble solvent with the water-insoluble solvent.

Figure 13:
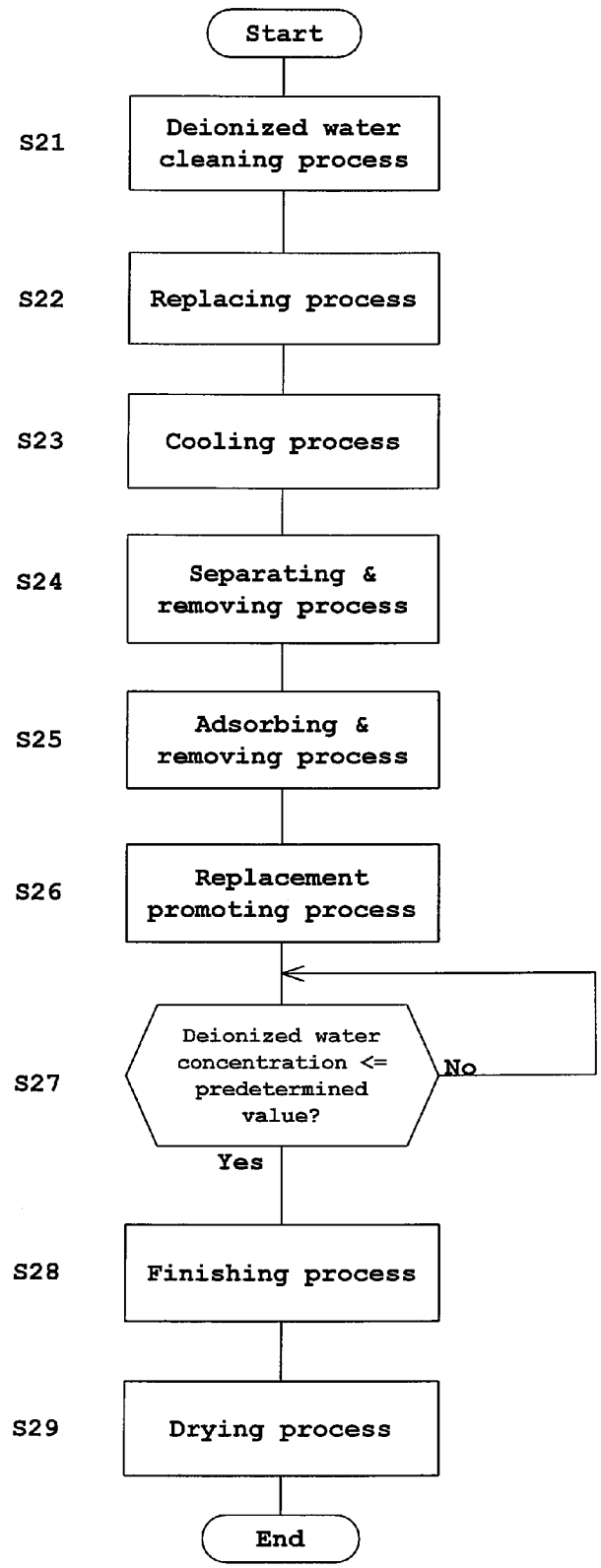
FIG. 13 is a flow chart of operation.

Next, operation of the above substrate treating apparatus will be described with reference to FIG. 13. FIG. 13 is a flow chart of operation.

Step S21

The controller 194 switches the three-way valve 15 to a position for allowing circulation, switches the three-way valves 19, 151 and 152 to positions for communication with the supply pipe 11, opens the control valve 158, and adjusts the flow control valve 160 to supply deionized water in a predetermined flow rate from the deionized water source 157 through the injection pipe 156 and supply pipe 11 to the inner tank 3. After filling all of the inner tank 3, outer tank 5 and supply pipe 11 with deionized water, the controller 194 operates the pump 17 and in-line heater 153 to heat the deionized water to a predetermined temperature (e.g. 60° C.). After the predetermined temperature is reached, the controller 194 lowers the holding arm 7 from the standby position to the treating position, and maintains the holding arm 7 in the treating position for a predetermined time. As a result, the wafers W are cleaned with the deionized water heated to the predetermined temperature.

Step S22

The controller 194 stops the in-line heater 153 and pump 17, switches the three-way valve 15 to a drain position, and closes the flow control valve 160. The controller 194 adjusts the flow control valve 166 to a predetermined flow rate to supply IPA to the supply pipe 11. After the inner tank 3 and outer tank 5 are filled with IPA, the controller 194 switches the three-way valve 15 to the position for communication with the supply pipe 11, and operates the pump 17. As a result, a large part of deionized water in the treating solution is discharged, and IPA is mixed into the treating solution whereby the deionized water is replaced with IPA.

Step S23

The controller 194 switches the three-way valves 151 and 152 to positions for communication with the first branch pipe 154, and causes the cooling unit 155 to cool the treating liquid to a predetermined temperature. By cooling the treating liquid to this level, deionized water is rendered not easily soluble in IPA.

Step S24

The controller 194 opens the control valves 176, 178 and 179, and switches the three-way valve 19 to a position for communication with the second branch pipe 167. As a result, the treating liquid passes through the oil-water separation filter 168 after IPA and deionized water are fully mixed by the static mixer 171.

At this time, the flow control valve 175 may be adjusted to inject a small quantity of deionized water into the treating liquid flowing through the static mixer 171. A deionized water concentration in the solvent below a certain value would lower the efficiency of the oil-water separation filter 168 separating deionized water and solvent. Deionized water is positively injected and mixed into the treating liquid having a reduced deionized water concentration, so that the oil-water separation filter 168 may separate deionized water below the certain value as drawn out by the injected deionized water.

After executing above process for a predetermined time, the controller 194 opens the control valves 177 and 180, and closes the control valves 178 and 179, to switch the channel to the fourth branch pipe 172, providing a bypass for the treating liquid to circumvent the static mixer 171. As a result, the treating liquid with a reduced deionized water concentration passes only through the oil-water separation filter 168. It is possible to omit the fourth branch pipe 172 so that the treating liquid may always flow through the static mixer 171.

Step S25

The controller 194 opens the control valves 177 and 180, and closes the control valves 178 and 179. As a result, the treating liquid (largely IPA) with a reduced deionized water concentration flows into the third branch pipe 169. A small quantity of deionized water remaining in the treating liquid is adsorbed and removed by the adsorption filter 170.

Step S26

After executing above adsorbing and removing process for a predetermined time, the controller 194 switches the control valve 15 to the drain position, and switches three-way valves 19, 151 and 152 to the positions for communication with the supply pipe 11. Further, the controller 194 adjusts the flow control valve 165 to supply HFE at a low flow rate to the inner tank 3. As a result, IPA is gradually pushed up by HFE without mixing therewith, to be discharged from the inner tank 3 and replaced by HFE. However, a small quantity of deionized water still remains in the treating liquid and in the fine patterns on the wafers W. After the inner tank 3 is filled with HFE, the controller 194 closes the control valve 158 and flow control valve 165, switches the three-way valve 19 for communication with the second branch pipe 167, opens the control valves 178 and 179, and closes the control valve 173. As a result, as in step S24 above, the treating liquid including HFE circulates through the static mixer 171 and oil water separation filter 168 to have the deionized water removed. After a predetermined time of deionized water removal by the oil-water separation filter 168, the controller 194 switches the channel as in step S25 for adsorption and removal by the adsorption filter 170.

Step S27

The controller 194 refers to the concentration meter 193, and performs the adsorbing process with the adsorption filter 170 until the deionized water concentration in the treating liquid falls to or below a predetermined value. The predetermined value is 0.1[%] or less, for example.

Step S28

The controller 194 carries out a finishing process by injecting IPA again into the treating liquid with a reduced deionized water concentration.

Specifically, the controller 194 opens the control valve 158, and adjusts the flow control valve 166 to inject a small quantity of IPA into the treating liquid. Its concentration is about 5 to 10%, for example. The adsorbing and removing action of the adsorption filter 170 is maintained in this state, whereby a slight quantity of deionized water is removed from the treating liquid including mostly HFE and a small quantity of IPA. As a result, the deionized water remaining also in the fine patterns on the wafers W can be drawn out and removed.

Step S29

After executing above process for a predetermined time, the controller 194 supplies solvent vapor from the nozzle, not shown, to form a solvent atmosphere around the treating tank 1. The holding arm 7 is raised to volatilize HFE adhering to the wafers W and dry the wafers W.

According to this embodiment, as described above, the controller 194 carries out the deionized water cleaning process for cleaning the wafers W in the treating tank 1 with deionized water by supplying deionized water from the filling pipe 156 to the supply pipe 11. This process removes chemicals, contaminants and the like from the wafers W with deionized water. Next, the controller 194 carries out the replacing process for injecting IPA through the mixing valve 159, and replacing the deionized water with IPA. After replacing the deionized water stored in the treating tank 1 with IPA, the controller 194 carries out the cooling process by switching the channel to the first branch pipe 154 for the cooling unit 155 to cool the treating liquid. Subsequently, the controller 194 carries out the separating and removing process by switching the channel to the second branch pipe 167 for the oil-water separation filter 168 to remove deionized water from the treating liquid. Deionized water can be removed efficiently from the treating liquid since the treating liquid has been cooled in the cooling process to render the deionized water not readily dissolvable in IPA. Then, the replacement promoting process is performed by injecting HFE through the mixing valve 159. IPA and deionized water are replaceable nearly completely with HFE since IPA and deionized water are made not readily dissolvable in HFE in the preceding cooling process. Thus, the deionized water in the treating tank 1 can be removed efficiently to prevent the deionized water from remaining in the fine patterns formed on the wafers W. As a result, this apparatus can prevent collapse of the fine patterns formed on the wafers W.

This invention is not limited to the foregoing embodiment, but may be modified as follows:

(1) The foregoing embodiment provides the static mixer 171 for fully mixing the water-insoluble solvent with deionized water prior to passage through the oil-water separation filter 168. However, the static mixer 171 is not absolutely necessary, and may be omitted. This simplifies the apparatus construction.

(2) The foregoing embodiment uses, by way of example, fluoric HFE as water-insoluble solvent, and IPA as water-soluble solvent. This invention is applicable to other solvents. It is possible to use, for example, HFC (hydrofluorocarbon) as fluoric solvent other than HFE.

(3) The foregoing embodiment provides the concentration meter 193 mounted in the inner tank 3 for measuring deionized water concentration. This construction may be modified to measure deionized water concentration in the treating liquid circulating through the supply pipe 11.

(4) In the foregoing embodiment, the "finishing process" is performed before the drying process. However, the "finishing process" may be omitted where the deionized water concentration is sufficiently reduced in the "replacement promoting process".

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating method for treating substrates with a treating liquid, for use with a substrate treating apparatus having:
   a treating tank for storing the treating liquid;
   a supply pipe for circulating the treating liquid to supply the treating liquid discharged from the treating tank back to the treating tank;
   a first branch pipe shunted from the supply pipe;
   a cooling device mounted on the first branch pipe for cooling the treating liquid flowing therethrough;
   a second branch pipe interconnecting positions of the supply pipe upstream and downstream of the cooling device;
   a separating device mounted on the second branch pipe for separating deionized water and a solvent in the treating liquid, and discharging the deionized water from the treating liquid;

an injection pipe connected to the supply pipe for injecting deionized water in a position downstream of the separating device;

a third branch pipe interconnecting positions of the supply pipe upstream and downstream of the separating device;

a deionized water removing device mounted on the third branch pipe for adsorbing and removing the deionized water from the treating liquid;

a water-soluble solvent injecting device for injecting a water-soluble solvent into the injection pipe; and a water-insoluble solvent injecting device for injecting a water-insoluble solvent into the injection pipe;

said method comprising:

a deionized water cleaning step for cleaning the substrates inside the cleaning tank with deionized water;

a replacing step for injecting the water-soluble solvent from said water-soluble injecting device into said supply pipe and replacing the deionized water with the water-soluble solvent;

a cooling step executed by switching a channel to said first branch pipe for said cooling device to cool the treating liquid;

a separating and removing step executed by switching a channel to said second branch pipe for said separating device to remove the deionized water from the treating liquid;

an adsorbing and removing step executed, after said separating and removing step, by switching the channel to said third branch pipe for removing the deionized water from the treating liquid;

a replacement promoting step for injecting the water-insoluble solvent from said water-insoluble solvent injecting device into said supply pipe;

a determining step for determining whether a deionized water concentration in the treating liquid has fallen to a predetermined value; and a finishing step, executed when the deionized water concentration in the treating liquid has fallen to the predetermined value, for injecting the water soluble solvent again into the treating liquid of reduced deionized water concentration, so as to further decrease the deionized water concentration in the treating liquid.

2. The method according to claim 1, wherein said cooling step is carried out after said replacing step.

3. The method according to claim 2, wherein said separating and removing step is carried out after said cooling step.

4. The method according to claim 1, wherein said adsorbing and removing step is performed after said separating and removing step.

5. The method according to claim 4, wherein said replacement promoting step is performed after said adsorbing and removing step.

6. The method according to claim 1, wherein the apparatus further includes
a mixer mounted on said second branch pipe upstream of said separating device for mixing deionized water and the solvent; and
a fourth branch pipe interconnecting a position upstream of said mixer; and a position downstream of said mixer and upstream of said separating device; and
wherein the channel is switched to said mixer for said separating and removing step and said replacement promoting step; and
the channel is switched to said fourth branch pipe for the other steps than said separating and removing step and said replacement promoting step.

7. The method according to claim 1, wherein said separating and removing step is carried out after said replacing step.

8. The method according to claim 1, wherein said method steps are carried out in the stated order.

9. The method according to claim 1, wherein said separating and removing step is carried out after said cooling step.

10. The method according to claim 1, wherein said replacement promoting step is performed after said separating and removing step.

* * * * *